United States Patent
Ahn et al.

(10) Patent No.: US 9,929,249 B1
(45) Date of Patent: Mar. 27, 2018

(54) SEMICONDUCTOR DEVICE AND METHOD FOR FABRICATING THE SAME

(71) Applicant: SK hynix Inc., Gyeonggi-do (KR)

(72) Inventors: Tae-Hang Ahn, Seoul (KR); Oh-Hyun Kim, Gyeonggi-do (KR); Seung-Beom Baek, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/672,794

(22) Filed: Aug. 9, 2017

(30) Foreign Application Priority Data

Dec. 27, 2016 (KR) .................. 10-2016-0180376

(51) Int. Cl.
| | | |
|---|---|---|
| *H01L 21/336* | (2006.01) | |
| *H01L 29/66* | (2006.01) | |
| *H01L 29/423* | (2006.01) | |
| *H01L 27/108* | (2006.01) | |
| *H01L 21/768* | (2006.01) | |
| *H01L 21/02* | (2006.01) | |

(52) U.S. Cl.
CPC ...... *H01L 29/665* (2013.01); *H01L 21/02293* (2013.01); *H01L 21/76829* (2013.01); *H01L 27/10855* (2013.01); *H01L 29/4236* (2013.01); *H01L 27/10876* (2013.01)

(58) Field of Classification Search
CPC ............ H01L 29/78618; H01L 29/665; H01L 21/32053; H01L 21/32051; H01L 29/4975; H01L 21/02293
USPC .................................................. 438/285, 721
See application file for complete search history.

(56) References Cited

U.S. PATENT DOCUMENTS

| | | | |
|---|---|---|---|
| 2004/0021164 A1* | 2/2004 | Kim .................. | H01L 27/10873 257/306 |
| 2013/0109144 A1* | 5/2013 | Kim .................. | H01L 21/02532 438/301 |
| 2014/0110851 A1 | 4/2014 | Kim et al. | |
| 2015/0050805 A1 | 2/2015 | Oh et al. | |
| 2015/0061134 A1 | 3/2015 | Lee et al. | |
| 2017/0162450 A1* | 6/2017 | Liao .................. | H01L 21/82387 |

FOREIGN PATENT DOCUMENTS

KR      1020070003034      1/2007

* cited by examiner

*Primary Examiner* — Thien F Tran
(74) *Attorney, Agent, or Firm* — IP & T Group LLP

(57) ABSTRACT

A method for fabricating a semiconductor device includes: forming a semiconductor structure including a pattern; forming an epitaxial layer having a first dopant concentration in the pattern; forming in-situ an interface layer having a second dopant concentration higher than the first dopant concentration, over the epitaxial layer; forming a metal silicide layer over the interface layer; and forming a metal plug over the metal silicide layer.

20 Claims, 20 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2016-0180376, filed on Dec. 27, 2016, which is incorporated herein by reference in its entirety.

BACKGROUND

1. Field

Exemplary embodiments of the present invention relate to a semiconductor structure and, more particularly, to a semiconductor device including a contact structure, and a method for fabricating the semiconductor device.

2. Description of the Related Art

When a contact structure of a semiconductor device is fabricated, an Ohmic contact may be formed to suppress the increase in leakage current and contact resistance. According to known technology, a silicide layer may be formed to form an Ohmic contact. To keep up with the trend of miniaturization of semiconductor devices, the aspect ratio of a contact structure is increasing.

SUMMARY

Embodiments of the present invention are directed to a semiconductor device having an improved contact structure, and a method for fabricating the semiconductor device. The contact structure may be formed in an opening of the semiconductor device having a high aspect ratio without a void.

In accordance with an embodiment of the present invention, a method for fabricating a semiconductor device is provided, the method including: forming a semiconductor structure including a pattern of a high aspect ratio; forming an epitaxial layer having a first dopant concentration in the pattern; forming in-situ an interface layer having a second dopant concentration higher than the first dopant concentration, over the epitaxial layer; forming a metal silicide layer over the interface layer; and forming a metal plug over the metal silicide layer.

The epitaxial layer may be formed through a selective epitaxial growth (SEG) process, and after the selective epitaxial growth process, an in-situ gas-phase doping process may be performed to form the interface layer.

The selective epitaxial growth process may include supplying a silicon source gas and an N-type dopant gas in-situ, and the in-situ gas-phase doping process includes supplying a phosphorus-containing dopant gas.

A phosphorus concentration of the interface layer that is formed through the in-situ gas-phase doping process may range from approximately $1.0 \times 10^{19}$ atoms/cm$^3$ to approximately $1.0 \times 10^{22}$ atoms/cm$^3$.

The in-situ gas-phase doping process may be performed at a temperature ranging from approximately 350° C. to approximately 1000° C.

The epitaxial layer and the interface layer may include an identical dopant.

The epitaxial layer and the interface layer include SiP, and the phosphorus concentration of the interface layer may be higher than a phosphorus concentration of the epitaxial layer.

The epitaxial layer may include SEG Si doped with an N-type dopant, SEG SiGe doped with an N-type dopant, or SEG SiC doped with an N-type dopant, and the interface layer may include SEG Si doped with phosphorus, SEG SiGe doped with phosphorus, or SEG SiC doped with phosphorus, and the phosphorus concentration of the interface layer may be higher than an N-type dopant concentration of the epitaxial layer.

The epitaxial layer may be formed through a first selective epitaxial growth process, and the interface layer may be formed through a second selective epitaxial growth process in-situ after the first selective epitaxial growth process.

The interface layer may be formed thinner than the epitaxial layer.

The first selective epitaxial growth process may include supplying a silicon source gas and an N-type dopant gas in-situ, and the second selective epitaxial growth process may include supplying a silicon source gas and a phosphorus-containing dopant gas.

A phosphorus concentration of the interface layer that is formed through the second selective epitaxial growth process may range from approximately $1.0 \times 10^{19}$ atoms/cm$^3$ to approximately $1.0 \times 10^{22}$ atoms/cm$^3$.

The epitaxial layer may include a first SEG SiP, and the interface layer may include a second SEG SiP whose phosphorus concentration is higher than a phosphorus concentration of the first SEG SiP.

The forming of the semiconductor structure including the pattern of the high aspect ratio may include: preparing a semiconductor substrate; forming a source/drain region of a transistor in the semiconductor substrate; forming an isolation layer over the semiconductor substrate; and etching the isolation layer to form a contact hole that exposes the source/drain region, wherein the epitaxial layer, the interface layer, the metal silicide layer, and the metal plug may become a contact structure that fills the contact hole.

The forming of the semiconductor structure including the pattern of the high aspect ratio may include: preparing a semiconductor substrate; burying a word line in the semiconductor substrate; forming a source/drain region in the semiconductor substrate on both sides of the word line; forming a plurality of bit line structures on top of the semiconductor substrate; and forming a contact hole that exposes the source/drain region between the plurality of the bit line structures, wherein the epitaxial layer, the interface layer, the metal silicide layer, and the metal plug may become a contact structure that fills the contact hole.

The method may further include: forming a memory element over the metal plug, after the forming of the metal plug.

The forming of the semiconductor structure including the pattern of the high aspect ratio may include: forming a gate structure over a substrate; and removing a portion of the substrate to form a source/drain recess below both sides of the gate structure, wherein the epitaxial layer and the interface layer may become a source/drain region that fills the source/drain recess.

The high aspect ratio may include a width-to-height ratio that is greater than approximately 1:1.

The metal silicide layer may include a cobalt silicide, a titanium silicide, or a nickel silicide.

The metal plug may include titanium, a titanium nitride, tungsten, or a combination thereof.

In accordance with another embodiment of the present invention, a semiconductor device includes: a semiconductor structure including a contact hole of a high aspect ratio; an epitaxial layer having a first dopant concentration and filling a lower portion of the contact hole; a metal silicide layer over the epitaxial layer; a metal plug over the metal silicide layer; and an interface layer between the metal silicide layer and the epitaxial layer, wherein the interface layer is disposed inside an upper portion of the epitaxial layer, and the interface layer has a second dopant concentration that is higher than the first dopant concentration.

The epitaxial layer and the interface layer may include an identical dopant.

The epitaxial layer may be doped with an N-type dopant, and the interface layer is doped with phosphorus.

The epitaxial layer may include a first SEG SiP, and the interface layer may include a second SEG SiP whose phosphorus concentration is higher than a phosphorus concentration of the first SEG SiP.

The second dopant concentration may range from approximately $1.0 \times 10^{19}$ atoms/cm$^3$ to approximately $1.0 \times 10^{22}$ atoms/cm$^3$.

The epitaxial layer may include SEG Si doped with an N-type dopant, SEG SiGe doped with an N-type dopant, or SEG SiC doped with an N-type dopant, and the interface layer may include SEG Si doped with phosphorus, SEG SiGe doped with phosphorus, or SEG SiC doped with phosphorus, and the phosphorus concentration of the interface layer may be higher than an N-type dopant concentration of the epitaxial layer.

The semiconductor structure may include: a semiconductor substrate; a word line buried in the semiconductor substrate; first and second source/drain regions that are formed in the semiconductor substrate on both sides of the word line; a bit line contact plug formed over the first source/drain region; and a bit line formed over the bit line contact plug, wherein the pattern of the high aspect ratio includes a contact hole that exposes the second source/drain region.

The semiconductor device may further include: a memory element that is formed over the metal plug.

DETAILED DESCRIPTION

Figure 1:
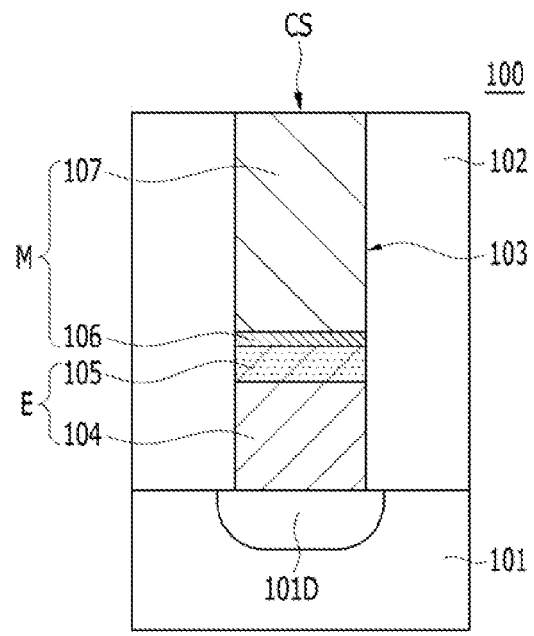
FIG. 1 is a cross-sectional view illustrating a semiconductor device, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. For example, in the drawings, the size of elements and the intervals between elements may be exaggerated compared to actual sizes and intervals for convenience of illustration.

When a drawing or a detailed description describes a multi-layer structure having two or more layers, the relative positional relationship or arrangement order of the illustrated layers just reflects a particular embodiment. Also, the drawing or the detailed description of the multi-layer structure may not reflect all the layers existing in a particular multi-layer structure (for example, there may be one or more additional layers between the two illustrated layers).

When a first layer is referred to as being "on" a second layer or "on" a substrate, it not only refers to a case where the first layer is formed directly on the second layer or the substrate but also a case where a third layer exists between the first layer and the second layer or the substrate.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" Includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereafter, in the following embodiments of the present invention, a high-aspect-ratio pattern may include an opening, a contact hole, and source/drain recesses. The high aspect ratio, which is a height-to-width ratio, may be greater than 1:1. For example, the high aspect ratio may be greater than 1:10. The lower portion of the high-aspect-ratio pattern may be filled with an epitaxial layer through a bottom-up growth process. The bottom-up growth process may include a selective epitaxial growth process. An interface layer may be formed through an in-situ gas-phase deposition process or an in-situ selective epitaxial growth process after the epitaxial layer is formed.

Hereinafter, embodiments will be described in more detail with reference to the accompanying drawings.

FIG. 1 is a cross-sectional view illustrating a semiconductor device in accordance with an embodiment of the present invention.

Referring to FIG. 1, the semiconductor device 100 may include a contact structure CS.

An insulation layer 102 may be formed over a substrate 101 including a doped region 101D. A high-aspect-ratio pattern penetrating the insulation layer 102 may be formed as an opening 103 penetrating through the insulation layer 102 and partially exposing a central portion of the top surface of the doped region 101D. The contact structure CS may be formed in the inside of the opening 103. The contact structure CS may include an epitaxial structure E and a metal structure M. The epitaxial structure E may contact the doped region 101D of the substrate 101, and the metal structure M may be formed over the epitaxial structure E. The epitaxial structure E may include an epitaxial layer 104 in direct contact with the doped region 101D and an interface layer 105 formed on top of the epitaxial layer 104. The metal structure M may include a metal silicide layer 106 in direct contact with the interface layer 105 and a metal layer 107 formed on top of the silicide layer 106. Due to the metal silicide layer 106, an Ohmic contact may be formed between the epitaxial structure E and the metal layer 107. By virtue of the interface layer 105, a resistance of the contact structure CS may be decreased.

The substrate 101 may be made of any suitable material for semiconductor processing. The substrate 101 may include a semiconductor substrate. For example, the substrate 101 may include a silicon substrate, a silicon germanium (SiGe) substrate, or a Silicon-On-Insulator (SOI) substrate. The doped region 101D of the substrate 101 may be doped with an N-type dopant or a P-type dopant. The doped region 101D may form the source/drain regions of a transistor.

The insulation layer 102 may be made of any suitable insulating material including an oxide, a nitride, a low-k material, or a combination thereof. For example, the insulation layer 102 may include $SiO_2$, TEOS (tetraethyl orthosilicate), PSG (phosphosilicate glass), BPSG (borophosphosilicate glass), BSG (borosilicate glass), or SOD (Spin-On-Dielectrics). The insulation layer 102 may be a single layer or a multi-layer. The insulation layer 102 may be formed through a Chemical Vapor Deposition (CVD) process or any other suitable technique.

The opening 103 is also referred to hereinafter as 'a contact hole'. From a top view perspective, the opening 103 may be of a circular shape or a rectangular shape.

The epitaxial layer 104 may be formed through a bottom-up growth process. The bottom-up growth process may include an epitaxial growth process. The epitaxial growth process may include a selective epitaxial growth process. The epitaxial layer 104 may include a silicon-containing epitaxial layer. For example, the epitaxial layer 104 may include a silicon epitaxial layer. Since the epitaxial layer 104 may be formed through the selective epitaxial growth (SEG) process, the epitaxial layer 104 may include silicon that is formed through the selective epitaxial growth process.

The epitaxial layer 104 may include a dopant. Therefore, the epitaxial layer 104 may be a doped epitaxial layer. The epitaxial layer 104 may be doped with an N-type dopant. The N-type dopant may include phosphorus, arsenic, antimony, or a combination thereof. A dopant concentration in the epitaxial layer 104 may be lower than approximately $1 \times 10^{19}$ atoms/cm$^3$. The dopant concentration in the epitaxial layer 104 may be uniform in the direction of thickness (the vertical direction according to FIGS. 1 and 2). The epitaxial layer 104 may be thicker than the interface layer 105. The epitaxial layer 104 and the interface layer 105 may be formed of the same material.

The interface layer 105 may be disposed between the epitaxial layer 104 and the metal silicide layer 106. The interface layer 105 may include a silicon-containing epitaxial layer. The interface layer 105 may include a silicon epitaxial layer. Since the interface layer 105 may be formed through the selective epitaxial growth (SEG) process, the interface layer 105 may include silicon that is formed through the selective epitaxial growth process.

The interface layer 105 may include a dopant. Therefore, the interface layer 105 may be a doped epitaxial layer. The interface layer 105 may be doped with phosphorus. The epitaxial layer 104 and the interface layer 105 may include the same dopant. A dopant concentration in the interface layer 105 may be higher than the dopant concentration in the epitaxial layer 104. For example, the dopant concentration in the interface layer 105 may be equal to or higher than approximately $1 \times 10^{19}$ atoms/cm$^3$. The dopant concentration in the interface layer 105 may be uniform in the direction of thickness.

As described above, the epitaxial structure E may include the epitaxial layer 104 and the interface layer 105. Each of the epitaxial layer 104 and the interface layer 105 may be doped with a dopant individually. Therefore, the epitaxial layer 104 may be called 'a doped epitaxial layer', and the interface layer 105 may be called 'a doped interface layer'. The epitaxial layer 104 may have a first dopant concentration, while the interface layer 105 has a second dopant concentration which is higher than the first dopant concentration. The second dopant concentration may range from approximately $1.0 \times 10^{19}$ atoms/cm$^3$ to approximately $1.0 \times 10^{22}$ atoms/cm$^3$. The first dopant concentration may be lower than approximately $1 \times 10^{19}$ atoms/cm$^3$. Both the epitaxial layer 104 and the interface layer 105 may be doped with phosphorus, and the first dopant concentration and the second dopant concentration may be a phosphorus doping concentration. The epitaxial layer 104 and the interface layer 105 may include a phosphorus-doped silicon epitaxial layer grown through the selective epitaxial growth process, i.e., a SEG SiP. The epitaxial layer 104 may be referred to as 'a lightly doped SEG SiP', and the interface layer 105 may be referred to as 'a heavily doped SEG SiP'.

According to an embodiment of the present invention, the epitaxial layer 104 may include SEG Si doped with an N-type dopant, SEG SiGe doped with an N-type dopant, or SEG SiC doped with an N-type dopant. The interface layer 105 may include SEG SiGe doped with phosphorus or SEG SiC doped with phosphorus. The concentration of phosphorus of the interface layer 105 may be higher than the concentration of the N-type dopant of the epitaxial layer 104.

The metal silicide layer 106 may include a cobalt silicide, a titanium silicide, or a nickel silicide.

The metal layer 107 may be made of a low-resistance metal material. The metal layer 107 may include a titanium, a titanium nitride, a tungsten, or a combination thereof. For example, the metal layer 107 may be made of a TiN/W with tungsten stacked over a titanium nitride.

The interface layer 105 of FIG. 1 may be formed through an in-situ gas-phase doping process that is performed right after the formation of the epitaxial layer 104. For example, the epitaxial layer 104 may be grown by using a source gas and an N-type dopant gas, and the in-situ gas-phase doping process may be performed by supplying a phosphorus-containing dopant gas. The in-situ gas-phase doping process may be performed in the order of a phosphorus-containing dopant gas adsorption process and an annealing process for activating and diffusing the dopant. An upper portion of the epitaxial layer 104 may be defined by the interface layer 105. In other words, the interface layer 105 may be positioned in the inside of the upper portion of the epitaxial layer 104. The in-situ gas-phase doping process may be described later.

Figure 2:
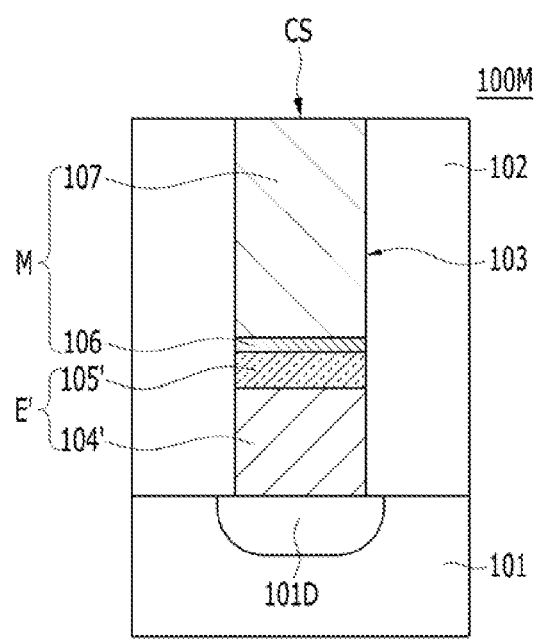
FIG. 2 is a cross-sectional view illustrating a semiconductor device, in accordance with an embodiment of the present invention.

FIG. 2 is a cross-sectional view illustrating a semiconductor device in accordance with an embodiment of the present invention. Some constituent elements of the semiconductor device 100M shown in FIG. 2 may be similar to those of the semiconductor device 100 shown in FIG. 1.

Referring to FIG. 2, an insulation layer 102 may be formed over a substrate 101. An opening 103 penetrating through the insulation layer 102 may be formed. A contact structure CS may be formed in the inside of the opening 103. The contact structure CS may include an epitaxial structure E' and a metal structure M. The epitaxial structure E' may contact the substrate 101, and the metal structure M may be formed over the epitaxial structure E'. The epitaxial structure E' may include an epitaxial layer 104' and an interface layer 105'. The metal structure M may include a metal silicide layer 106 and a metal layer 107. Due to the metal silicide layer 106, an Ohmic contact may be formed between the epitaxial structure E' and the metal layer 107.

The epitaxial layer 104' may be formed in the same method that the epitaxial layer 104 shown in FIG. 1 is formed.

The interface layer 105' may be formed through a method that is different from the method that the interface layer 105 of FIG. 1 is formed. For example, the interface layer 105' may be formed through an in-situ selective epitaxial growth (In-situ SEG) process, which is performed right after the formation of the epitaxial layer 104'. The epitaxial layer 104' may be formed through a bottom-up growth process.

The epitaxial layer 104' may be grown through a selective epitaxial growth process by using a source gas and an N-type dopant gas. The interface layer 105' may be grown in-situ through a selective epitaxial growth process by using a source gas and a phosphorus-containing dopant gas. The epitaxial layer 104' and the interface layer 105' may be formed of the same material. The epitaxial layer 104' and the interface layer 105' may be doped with the same dopant or different dopants. An N-type dopant may include phosphorus, arsenic, or antimony. The concentration of the dopant in the interface layer 105' may be higher than the concentration of the dopant in the epitaxial layer 104'. For example, the dopant concentration in the interface layer 105' may be equal to higher than approximately $1 \times 10^{19}$ atoms/cm$^3$. The dopant concentration in the epitaxial layer 104' may be lower than approximately $1 \times 10^{19}$ atoms/cm$^3$. The interface layer 105' may be thinner than the epitaxial layer 104'. The thickness of the interface layer 105' may range from approximately 100 Å to approximately 300 Å. The epitaxial layer 104' and the interface layer 105' may include SEG SiP, individually. The phosphorus concentration of the epitaxial layer 104' may be lower than approximately $1 \times 10^{19}$ atoms/cm$^3$, and the phosphorus concentration of the interface layer 105' may range from approximately $1.0 \times 10^{19}$ atoms/cm$^3$ to approximately $1.0 \times 10^{22}$ atoms/cm$^3$. According to another embodiment of the present invention, the epitaxial layer 104' may include SEG Si doped with an N-type dopant, SEG SiGe doped with an N-type dopant, or SEG SiC doped with an N-type dopant. The interface layer 105' may include SEG SiGe doped with phosphorus and SEG SiC doped with phosphorus. The phosphorus concentration of the interface layer 105' may be higher than the concentration of the N-type dopant of the epitaxial layer 104'.

As described above, the interface layer 105' may be formed as a thin layer from approximately 100 Å to approximately 300 Å over the epitaxial layer 104' through a selective epitaxial growth process.

Referring to FIGS. 1 and 2, since the epitaxial layers 104 and 104' are formed through the bottom-up growth process, the epitaxial layers 104 and 104' may fill the inside of the opening 103 without formation of any voids. Since the interface layer 105 and the interface layer 105' may be formed through the in-situ gas-phase doping process and the in-situ selective epitaxial growth process, respectively, the interface layer 105 and the interface layer 105' may be uniformly doped with a high concentration of phosphorus.

FIGS. 3A to 3H are cross-sectional views illustrating a method for fabricating the semiconductor device 100 in accordance shown in FIG. 1.

Figure 3A:
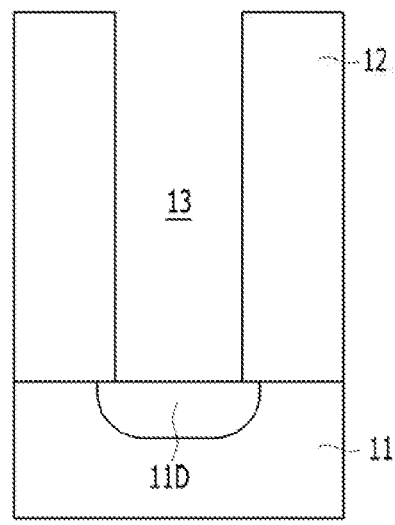
FIGS. 3A to 3H are cross-sectional views illustrating a method for fabricating the semiconductor device, in accordance with the first embodiment of the present invention.

Referring to FIG. 3A, a substrate 11 may be prepared. The substrate 11 may include a material suitable for a semiconductor processing. The substrate 11 may include a semiconductor substrate. The substrate 11 may be formed of a silicon-containing material. The substrate 11 may include one selected from a group including silicon, monocrystalline silicon, polysilicon, amorphous silicon, silicon germanium, monocrystalline germanium, polycrystalline germanium, carbon-doped silicon, and combinations thereof, or a multi-layer thereof. The substrate 11 may include another semiconductor material, such as germanium. The substrate 11 may include a III/V-group semiconductor substrate, e.g., a chemical compound semiconductor substrate, such as gallium arsenide (GaAs). The substrate 11 may include a Silicon-On-Insulator (SOI) substrate. The substrate 11 may include a doped region 11D. The doped region 11D may be doped with an N-type dopant or a P-type dopant. The doped region 11D may form the source/drain regions of a transistor.

An insulation layer 12 may be formed over the substrate 11. The insulation layer 12 may be a single layer or a multi-layer. The insulation layer 12 may be formed through a Chemical Vapor Deposition (CVD) or a Physical Vapor Deposition (PVD). The insulation layer 12 may include at least one selected from a group including an oxide, a nitride, or an oxynitride.

An opening 13 may be formed in the insulation layer 12. To form the opening 13, an etch process for etching the insulation layer 12 by using a mask pattern (not shown) may be performed. The etch process may be at least one selected from a group including a chemical dry etch process or a wet etch process. The opening 13 may expose a portion of the surface of the doped region 11D of the substrate 11. When viewed from a top view perspective, the opening 13 may have a circular shape or a rectangular shape. The opening 13 may be referred to as a contact hole. Sidewalls of the opening 13 may have a vertical profile. The opening 13 may have a height to width aspect ratio of approximately 10:1.

According to another embodiment of the present invention, a Damascene process may be performed to form the insulation layer 12 and the opening 13. For example, after a sacrificial layer pattern corresponding to the opening 13 is formed, the insulation layer 12 surrounding the sacrificial layer pattern may be formed. Subsequently, the opening 13 may be formed by removing the sacrificial layer pattern.

According to another embodiment of the present invention, after the opening 13 is formed, spacers may be further formed on the sidewalls of the opening 13.

Subsequently, a cleaning process before the formation of an epitaxial layer 14 may be performed as a pre-process. The pre-process may include a wet cleaning or a dry cleaning. The wet cleaning may include an HF-last cleaning. The dry cleaning may include a dry gas cleaning or a plasma cleaning. The dry cleaning may be performed using hydrogen or hydrogen/nitrogen mixed gas. The pre-process may be performed at a temperature from room temperature to approximately 900° C.

Figure 3B:
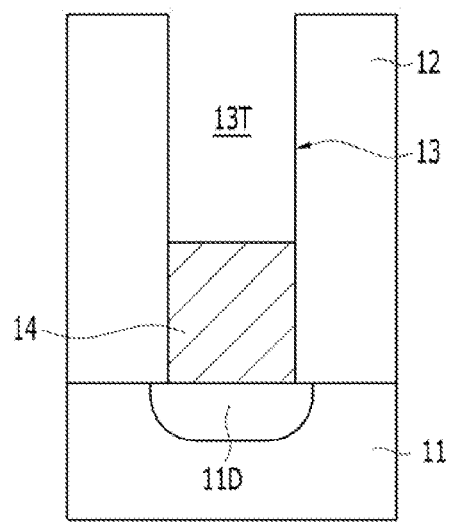

Referring to FIG. 3B, the epitaxial layer 14 may be formed. The epitaxial layer 14 may be formed through a bottom-up growth process. The bottom-up growth process may include an epitaxial growth process. The epitaxial growth process may be a selective epitaxial growth process. Since the epitaxial layer 14 is formed through the epitaxial growth process, the epitaxial layer 14 may be formed substantially free of voids. The epitaxial layer 14 may be formed through Low-Pressure Chemical Vapor Deposition (LPCVD), Very Low-Pressure Chemical Vapor Deposition (VLPCVD), Plasma-Enhanced Chemical Vapor Deposition (PE-CVD), Ultrahigh Vacuum Chemical Vapor Deposition (UHVCVD), Rapid Thermal Chemical Vapor Deposition (RTCVD), Atmosphere Pressure Chemical Vapor Deposition (APCVD), Molecular Beam Epitaxy (MBE), or another appropriate epitaxial growth process. The epitaxial layer 14 may be formed through an epitaxy process that is performed at least once. The epitaxial layer 14 may be formed through a Selective Epitaxial Growth (SEG). The epitaxial layer 14 may include a silicon-containing material. The epitaxial layer 14 may include a silicon layer. The epitaxial layer 14 may include a silicon epitaxial layer. Since the epitaxial layer 14 is formed through the selective epitaxial growth (SEG) process, the epitaxial layer 14 may include a SEG Si. The epitaxial layer 14 may be formed from the substrate 11 that is exposed through the bottom surface of the opening 13 i.e., from the surface of the doped region 11D, through the bottom-up process. According to a comparative example, when a polysilicon layer is deposited using a furnace equipment, voids may occur. Conversely, the epitaxial growth (SEG) process is performed in such a manner that the epitaxial layer 14 is grown upward from the surface of the substrate 11 only. Therefore, the epitaxial layer 14 may be grown substantially free of any voids. The epitaxial layer 14 may be referred to as a void-free epitaxial layer.

According to an embodiment of the present invention, the epitaxial layer 14 may include a silicon epitaxial layer. The epitaxial layer 14 including the silicon epitaxial layer may be formed by using a silicon source gas. The silicon source gas may be referred to as a silicon-containing precursor. The silicon source gas may include silane ($SiH_4$), disilane ($Si_2H_6$), trisilane ($Si_3H_8$), dichlorosilane ($SiH_2Cl_2$), or a combination thereof.

The epitaxial layer 14 may be formed by performing an in-situ doping process using a dopant gas. For example, the in-situ doping process may be performed by supplying a dopant gas while a silicon epitaxial layer is being grown by using a silicon source gas. The dopant gas may include an N-type dopant gas. The N-type dopant gas may include phosphorus, arsenic, antimony, or a combination thereof. The N-type dopant gas may include phosphine ($PH_3$) and asphine ($AsH_3$). The concentration of the N-type dopant in the epitaxial layer 14 may be lower than approximately $1\times10^{19}$ atoms/cm$^3$. For example, the epitaxial layer 14 in-situ doped with phosphorus may be formed using a mixed gas of $SiH_4/HCl/PH_3/H_2$ in a thickness of approximately 200 Å to approximately 1000 Å at a temperature of approximately 650° C. to 850° C. under the pressure of approximately 500 torr.

In this embodiment of the present invention, the epitaxial layer 14 may include a silicon epitaxial layer doped with phosphorus. The phosphorus-doped silicon epitaxial layer may be referred to as 'a SiP epitaxial layer'. The epitaxial layer 14 may have a low phosphorus concentration. The epitaxial layer 14 may have a phosphorus concentration lower than $1\times10^{19}$ atoms/cm$^3$. The phosphorus concentration in the epitaxial layer 14 may be uniform in the direction of thickness.

According to another embodiment of the present invention, the epitaxial layer 14 may include SEG Si doped with an N-type dopant, SEG SiGe doped with an N-type dopant, or SEG SiC doped with an N-type dopant.

The epitaxial layer 14 may fill a portion of the opening 13. For example, the epitaxial layer 14 may fill a lower portion of the opening 13. An upper portion 13T of the opening 13 may remain as an empty space. The selective epitaxial growth may have a portion of the opening 13 filled without performing an etch-back process. According to a comparative example, when a doped polysilicon layer is deposited, an etch-back process needs to be performed additionally to fill a portion of the opening 13. As a result, during the etch-back process, peripheral structures may be damaged inevitably and also the dopant may be lost.

Figure 3C:
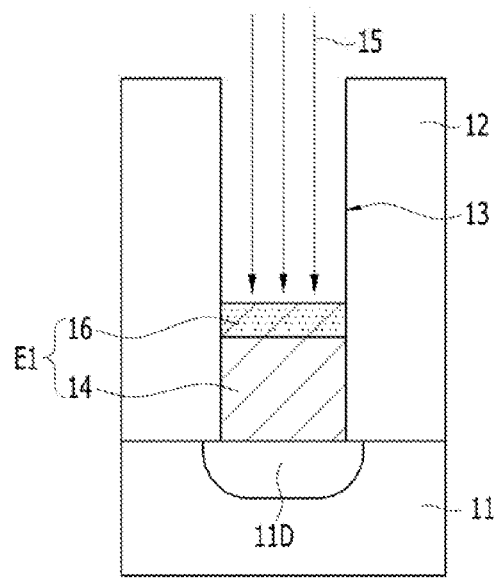

Referring to FIG. 3C, an in-situ gas-phase doping (GPD) process 15 may be performed. After the epitaxial layer 14 is formed, the in-situ gas-phase doping process 15 may be performed in-situ using the same equipment as used for the formation of the epitaxial layer 14. The in-situ gas-phase doping process 15 may be performed in the order of a dopant gas supplying process and an annealing process. During the dopant gas supplying process, dopants may be adsorbed on the surface of the epitaxial layer 14 by supplying a dopant gas. During the annealing process, the adsorbed dopants may be diffused and activated. Through the in-situ gas-phase doping process 15, the upper surface of the epitaxial layer 14 may be transformed into an interface layer 16. The interface layer 16 may have a high concentration of dopants. For example, the interface layer 16 may have a high dopant concentration that is higher than the dopant concentration of the epitaxial layer 14.

For example, to perform the in-situ gas-phase doping process 15, after the epitaxial layer 14 is formed, the supply of the source gas between the source gas and the dopant gas may be stopped. In short, the dopant gas alone may be supplied. An additional gas other than the dopant gas may be supplied. The additional gas may include a hydrogen gas or a nitrogen gas. The dopant gas may include a phosphorus-containing dopant gas. For example, the phosphorus-containing dopant gas may include phosphine ($PH_3$). The in-situ gas-phase doping process 15 may be performed at a high-temperature atmosphere, e.g., a temperature range of approximately 350° C. to approximately 1000° C. As described above, the upper portion of the epitaxial layer 14 may be doped with high-concentration phosphorus at a high temperature through a gas-phase method.

The interface layer 16 may be formed in the upper portion of the epitaxial layer 14. Therefore, the interface layer 16 may include the SEG SiP. The epitaxial layer 14 and the interface layer 16 may include the same dopant. For example, both of the epitaxial layer 14 and the interface layer 16 may include phosphorus. The epitaxial layer 14 and the interface layer 16 may include different dopants. The epitaxial layer 14 may include an N-type dopant other than phosphorus, and the interface layer 16 may include phosphorus. The interface layer 16 may include a doped silicon epitaxial layer. The dopant concentration of the interface layer 16 may be equal to or higher than approximately $1.0 \times 10^{19}$ atoms/cm$^3$. The interface layer 16 may include phosphorus (P), and the concentration of phosphorus may range from approximately $1.0 \times 10^{19}$ atoms/cm$^3$ to approximately $1.0 \times 10^{22}$ atoms/cm$^3$. The dopant concentration of the interface layer 16 may be higher than the dopant concentration of the epitaxial layer 14. The phosphorus concentration in the interface layer 16 may be uniform in the direction of thickness.

To take an example, when the epitaxial layer 14 and the interface layer 16 include SEG SiP, individually, the epitaxial layer 14 may be referred to as 'a lightly doped SEG SiP', and the interface layer 105 may be referred to as 'a heavily doped SEG SiP'.

As described above, after the epitaxial layer 14 is formed, the upper region of the epitaxial layer 14 may be doped in a high concentration at a high temperature through a gas-phase method by using a dopant gas.

Among the known doping technology is an ion implantation method. With the ion implantation method, it is difficult to form a shallow junction due to a channeling effect. Also, when a dopant is implanted, an ion implantation target may be damaged.

A gas-phase doping method may be able to form a shallow junction more easily than the ion implantation method. Also, the gas-phase doping method may not damage the doping target. Also, the gas-phase doping method may be able to maintain the dopant concentration more uniformly than the ion implantation method.

Subsequently, an annealing process may be performed. Through the annealing process, the dopants doped on the interface layer 16 may be diffused and activated. According to another embodiment of the present invention, the dopants may be diffused and activated through the annealing process to be performed to form a silicide layer 18 subsequently.

Through the series of processes that are described above, an epitaxial structure E1 electrically connected to the doped region 11D may be formed. The epitaxial structure E1 may include the epitaxial layer 14 and the interface layer 16.

Subsequently, through the method illustrated in FIGS. 3D to 3H, a metal structure M1 may be formed over the epitaxial structure E1.

Figure 3D:
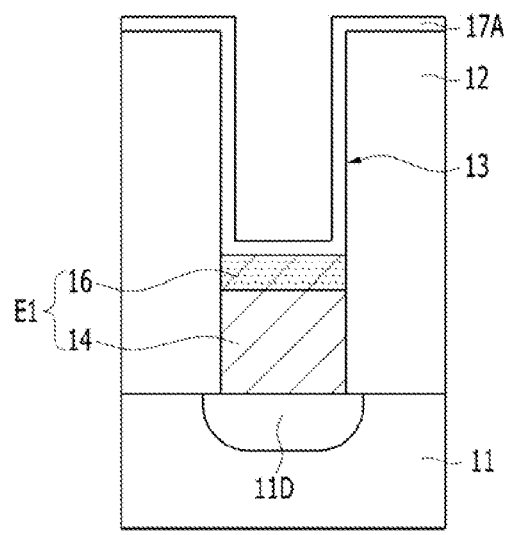

Referring to FIG. 3D, a silicidable metal layer 17A may be formed over the interface layer 16 and the insulation layer 12. The silicidable metal layer 17A may not fill the opening 13 but may be formed conformally to the opening 13. The silicidable metal layer 17A may be made of a silicidable metal material. For example, the metal contained in the silicidable metal layer 17A may react with the interface layer 16. According to an embodiment of the present invention, the silicidable metal layer 17A may include cobalt. The silicidable metal layer 17A may be formed through a deposition process, such as an Atomic Layer Deposition (ALD) process and a Chemical Vapor Deposition (CVD) process.

Before the silicidable metal layer 17A is formed, the surface of the interface layer 16 may be exposed. The surface of the interface layer 16 may include silicon. Therefore, a portion of the silicidable metal layer 17A may be formed over the surfaces containing silicon, and the other portion of the silicidable metal layer 17A may be formed over the insulation layer 12.

According to an embodiment of the present invention, the silicidable metal layer 17A may include such metals as titanium and nickel other than cobalt.

Figure 3E:
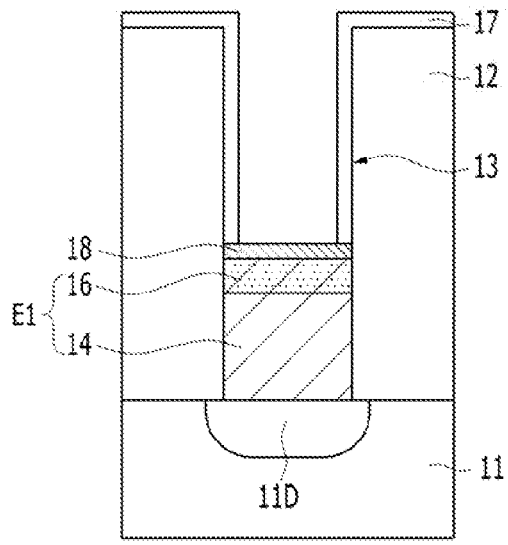

Referring to FIG. 3E, an annealing process may be performed. As a result of the annealing process, a metal silicide layer 18 may be formed. The metal silicide layer 18 may include a cobalt silicide.

The metal silicide layer 18 may be formed as the silicon of the interface layer 16 reacts with the metal of the silicidable metal layer 17A.

After the annealing process, an unreacted silicidable metal layer 17 may remain.

The metal silicide layer 18 is not limited to a cobalt silicide layer. For example, the silicide layer may be formed using another metal (e.g., titanium, nickel, etc.) capable of forming a silicide layer by reacting with silicon.

Figure 3F:
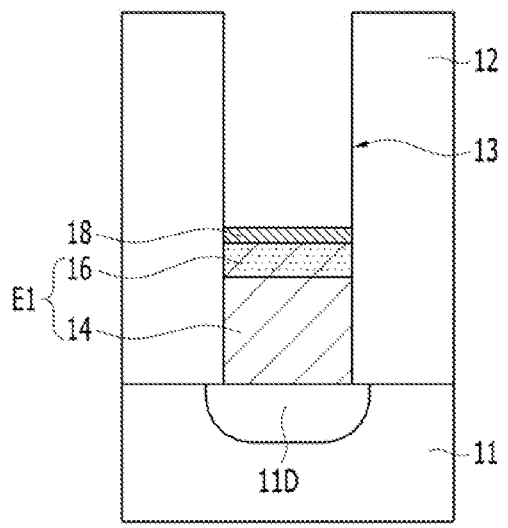

Referring to FIG. 3F, the unreacted silicidable metal layer 17 may be selectively removed. Accordingly, the epitaxial layer 14, the interface layer 16, and the metal silicide layer 18 may remain in the inside of the opening 13.

Figure 3G:
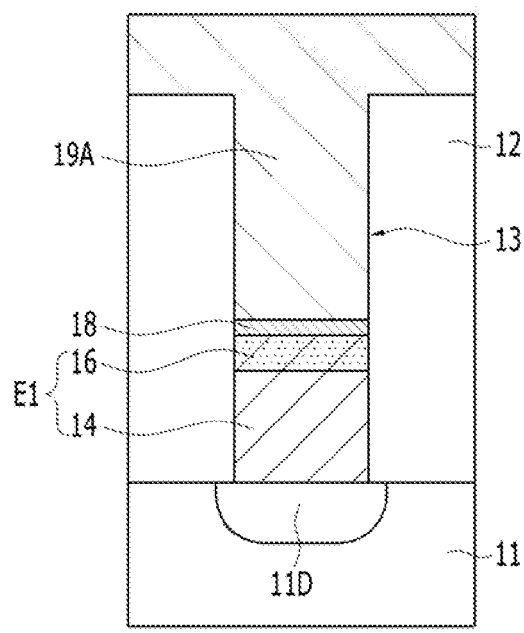

Referring to FIG. 3G, a gap-filling layer 19A may be formed in the opening 13. The gap-filling layer 19A may fill the upper portion of the opening 13 which is over the lower region of the opening 13 which is filled with the epitaxial structure E1. A portion of the gap-filling layer 19A may also cover the upper surface of the insulation layer 12. The gap-filling layer 19A may be made of a low-resistance conductive material having a lower resistance than the resistances of the epitaxial layer 14 and the interface layer 16. For example, the gap-filling layer 19A may include a metal layer. The gap-filling layer 19A may include TiN, TiN, Ti/TiN, W, or a combination thereof. For example, the gap-filling layer 19A may include a TiN/W stack where TiN and W are stacked in the mentioned order.

The gap-filling layer 19A may fill the opening 13 without formation of voids. The volume of the gap-filling layer 19A occupying the inside of the opening 13 may be bigger than that of the epitaxial structure E1. In this way, the volume of the metal material may be increased so as to decrease the resistance.

Figure 3H:
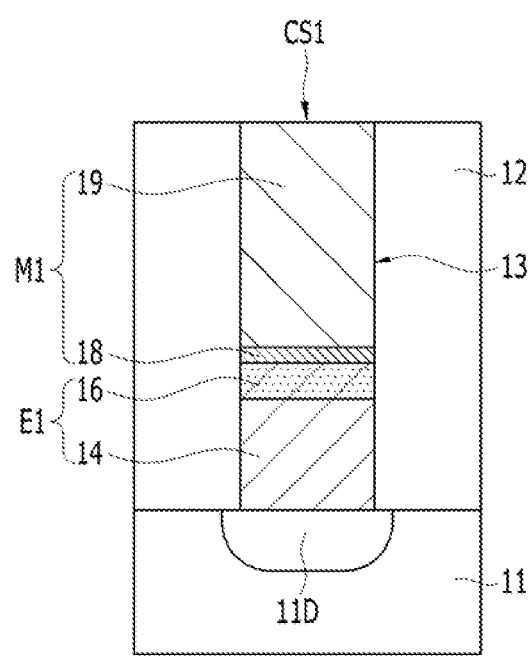

Referring to FIG. 3H, the gap-filling layer 19A may be selectively removed in such a manner that the gap-filling layer 19A remains in the opening 13. As a result, a metal plug 19 may be formed in the inside of the opening 13. The metal plug 19 may correspond to the metal layer 107 of FIGS. 1 and 2. To form the metal plug 19, a Chemical Mechanical Polishing (CMP) process may be performed. According to another embodiment of the present invention, an etch-back process may be performed to form the metal plug 19. According to yet another embodiment of the present invention, an etch process using a mask pattern (not shown) may be performed to form the metal plug 19.

Through the series of the processes described above, a metal structure M1 may be formed in the inside of the opening 13. The metal structure M1 may include the metal silicide layer 18 and the metal plug 19. The metal structure M1 may be positioned over the epitaxial structure E1. The height of the metal structure M1 may be higher than that of the epitaxial structure E1.

The epitaxial structure E1 and the metal structure M1 may become a contact structure CS1. The contact structure CS1 may be called a contact plug. Since the epitaxial structure E1 includes a silicon-based material and the metal structure M1 includes a metal-based material, the contact structure CS1 may be called 'a Semi-Metal Plug (SMP)' or 'a Hybrid Plug'.

According to an embodiment of the present invention described above, since the epitaxial layer 14 is formed through a selective epitaxial growth process, the opening 13 may be filled substantially free of any voids. Also, since it does not have to deposit a polysilicon layer and perform an etch-back process, the peripheral structure and dopants may not be damaged.

Also, to form the interface layer 16, phosphorus (P) may be doped in a high concentration through the in-situ gas-phase doping process 15. Therefore, since it does not have to perform the ion implantation process, there is no damage caused by ion implantation. Also, since phosphorus is distributed intensively in the upper portion of the epitaxial layer 14, it is advantageous in the formation of an Ohmic contact between the metal silicide layer 18 and the metal plug 19. Since phosphorus is positioned more on the substitutional sites through the subsequent annealing process, the dopants can be more well activated. As a result, the electrical characteristics such as the contact resistance may be improved.

Also, the in-situ gas-phase doping process 15 may be more simple than the ion implantation process. Generally, the ion implantation process requires a mask, an ion implantation, a subsequent thermal treatment, a cleaning, and a mask stripping. Since it does not have to make an investment on ion implantation equipment, production cost may be reduced.

Figure 4A:
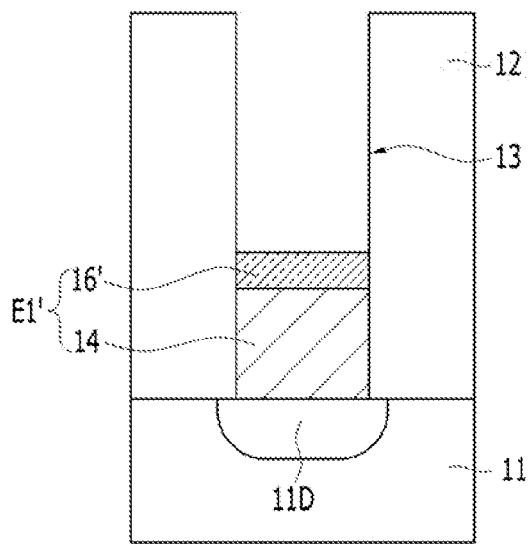
FIGS. 4A and 4B are cross-sectional views illustrating a method for fabricating the semiconductor device, in accordance with the second embodiment of the present invention.
Figure 4B:
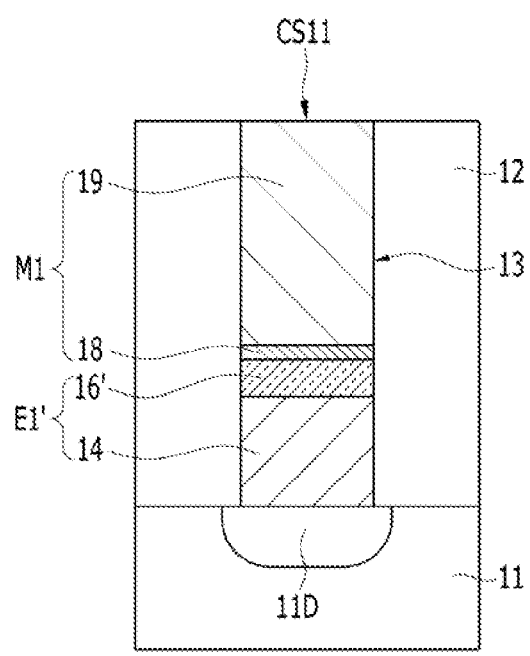

FIGS. 4A and 4B are cross-sectional views illustrating a method for fabricating the semiconductor device 100M shown in FIG. 2. The semiconductor device 100M shown in FIG. 2 may be formed in a similar way that the semiconductor device 100 in accordance with the first embodiment of the present invention shown is formed. For example, as shown in FIGS. 3A and 3B, the epitaxial layer 14 may be grown in the inside of the opening 13. Herein, the epitaxial layer 14 may be formed through a first selective epitaxial growth process. The epitaxial layer 14 may include a lightly doped SEG SiP.

Subsequently, referring to FIG. 4A, an interface layer 16' may be formed over the epitaxial layer 14. The interface layer 16' may be grown through a selective epitaxial grown process. For example, right after the epitaxial layer 14 is formed, the interface layer 16' may be grown through a second selective epitaxial growth process in situ.

The interface layer 16' may have a higher dopant concentration than the epitaxial layer 14, and the interface layer 16' may be thinner than the epitaxial layer 14. The thickness of the interface layer 16' may range from approximately 10 Å to approximately 300 Å.

To form the interface layer 16', the same process as performed for the epitaxial layer 14 may be performed. For example, the interface layer 16' may be formed through a Low-Pressure Chemical Vapor Deposition (LPCVD), a Very Low-Pressure Chemical Vapor Deposition (VLPCVD), a Plasma-Enhanced Chemical Vapor Deposition (PE-CVD), an Ultrahigh Vacuum Chemical Vapor Deposition (UHVCVD), a Molecular Beam Epitaxy (MBE), or another appropriate epitaxial growth process. The interface layer 16' may be formed through an epitaxial process that is performed at least once. The interface layer 16' may include a silicon epitaxial layer. The interface layer 16' may be formed in the upper portion of the epitaxial layer 14. The interface layer 16' including the silicon epitaxial layer may be formed using a silicon source gas. Examples of the silicon-containing gas may include silane ($SiH_4$), disilane ($Si_2H_6$), trisilane ($Si_3H_8$), dichlorosilane ($SiH_2Cl_2$), or a combination thereof.

The process for forming the interface layer 16' may include an in-situ doping process using a dopant gas. For example, while a silicon epitaxial layer is being grown by using the silicon source gas, the in-situ doping process may be performed by supplying the dopant gas. The dopant gas may include phosphorus. For example, the dopant gas may include phosphine ($PH_3$).

The interface layer 16' may include a phosphorus-doped silicon layer. The interface layer 16' may be a phosphorus-doped silicon (SiP) epitaxial layer. The interface layer 16' may have a high phosphorus concentration. The epitaxial layer 14 may have a phosphorus concentration lower than approximately $1 \times 10^{19}$ atoms/cm$^3$. The phosphorus concentration of the interface layer 16' may range from approximately $1.0 \times 10^{19}$ atoms/cm$^3$ to approximately $1.0 \times 10^{22}$ atoms/cm$^3$. The interface layer 16' may have a higher phosphorus concentration than the epitaxial layer 14. The phosphorus concentration of the interface layer 16' may be uniform in the direction of thickness. Due to the difference in the phosphorus concentrations, the epitaxial layer 14 may be referred to as 'a lightly doped SEG SiP', and the interface layer 16' may be referred to as 'a heavily doped SEG SiP'.

According to an embodiment of the present invention, the epitaxial layer 104 may include SEG Si doped with an N-type dopant, SEG SiGe doped with an N-type dopant, or SEG SiC doped with an N-type dopant.

Subsequently, an annealing process for diffusing and activating the dopants of the interface layer 16' may be performed.

Through the series of the processes described above, an epitaxial structure E1' electrically connected to the doped region 11D may be formed. The epitaxial structure E1' may include the epitaxial layer 14 and the interface layer 16'.

Subsequently, through the method illustrated in FIGS. 3D to 3H, the metal structure M1 may be formed over the epitaxial structure E1'.

FIG. 4B illustrates a resultant structure where the metal structure M1 is formed. Referring to FIG. 4B, a contact structure CS11 may be formed in the inside of the opening 13. The contact structure CS11 may include the epitaxial structure E1' and the metal structure M1. Therefore, the contact structure CS11 may include the epitaxial layer 14, the interface layer 16', the metal silicide layer 18, and the metal plug 19.

Figure 5A:
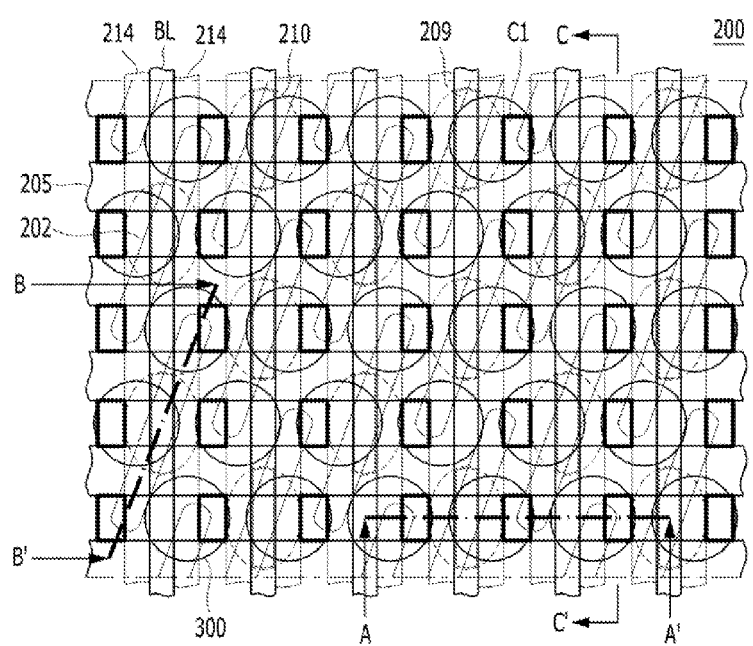
FIGS. 5A to 5C illustrate a semiconductor device, in accordance with an embodiment of the present invention.
Figure 5B:
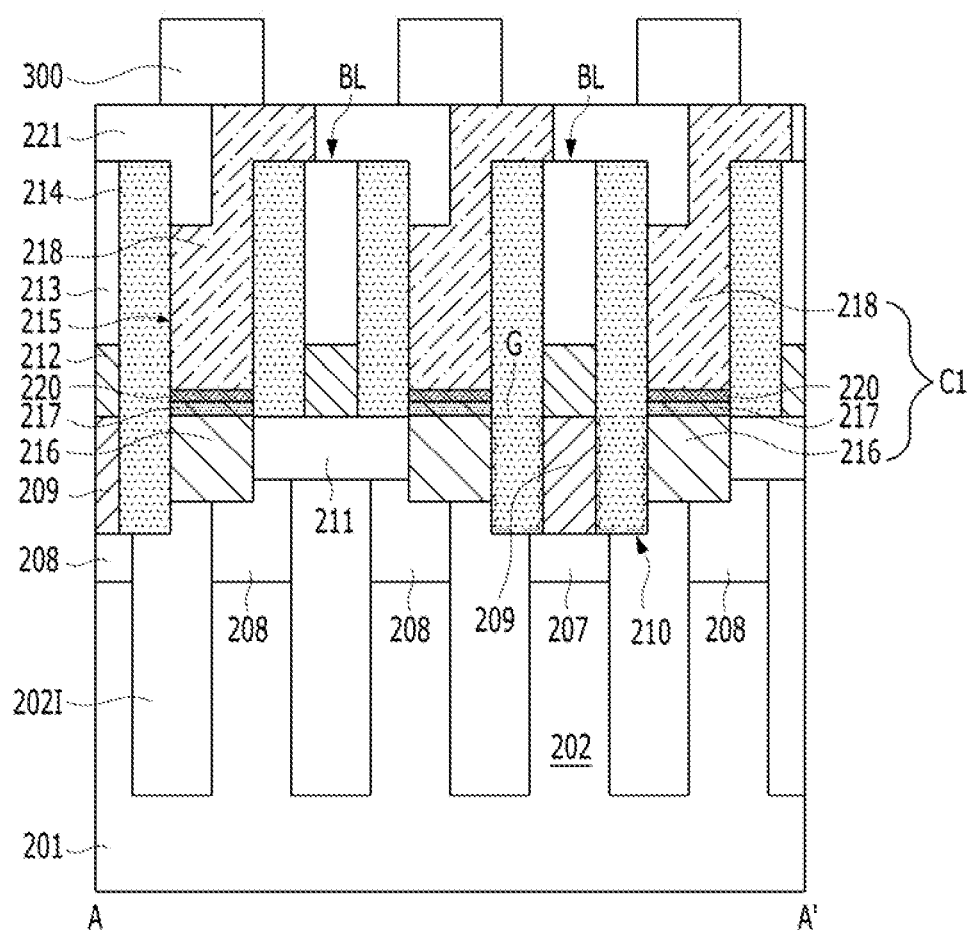
Figure 5C:
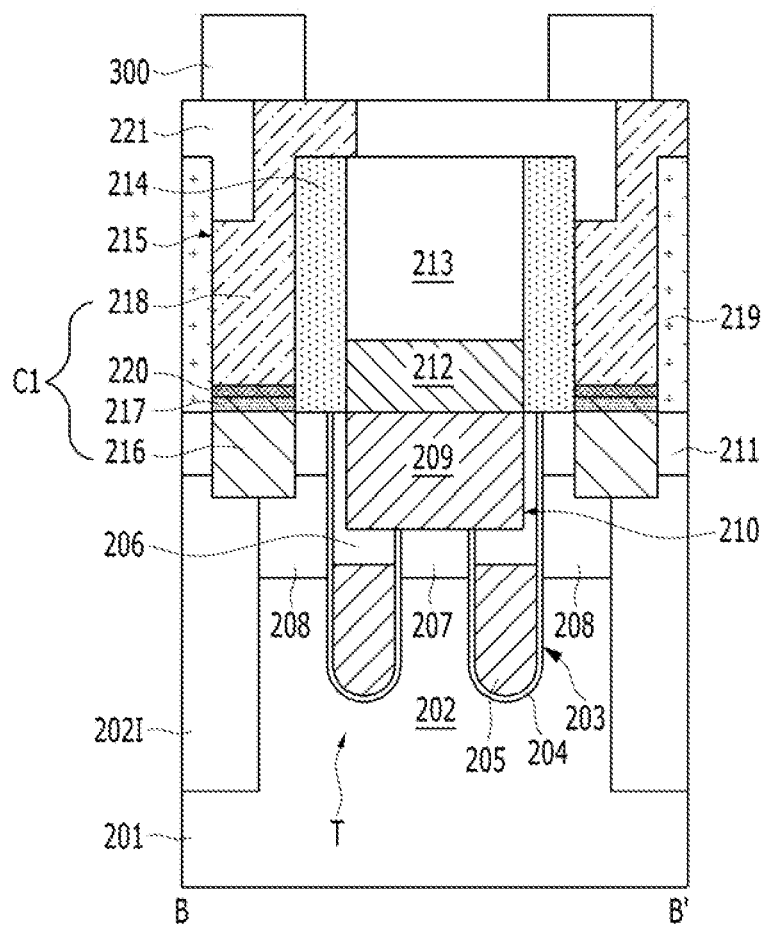

FIGS. 5A to 5C illustrate a semiconductor device in accordance with an embodiment of the present invention. In the embodiment of the present invention, a semiconductor device including memory cells, such as a Dynamic Random Access Memory (DRAM) device is described. FIG. 5A is a plan view of the semiconductor device in accordance with the embodiment of the present invention. FIG. 5B is a cross-sectional view of the semiconductor device taken along a line A-A' shown in FIG. 5A. FIG. 5C is a cross-sectional view of the semiconductor device taken along a line B-B' shown in FIG. 5A.

The semiconductor device 200 may include a plurality of memory cells. Each of the memory cells may include a cell transistor T including a buried word line 205, a bit line 212, and a memory element 300.

The semiconductor device 200 is described in detail.

An isolation layer 202I and an active region 202 may be formed in a substrate 201. The isolation layer 202I may define a plurality of active regions 202. The substrate 201 may include a material appropriate for semiconductor processing. The substrate 201 may include a semiconductor substrate. The substrate 201 may include a silicon-containing material. The substrate 201 may include one selected from a group including silicon, monocrystalline silicon, polysilicon, amorphous silicon, silicon germanium, monocrystalline germanium, polycrystalline germanium, carbon-doped silicon, and combinations thereof, or a multi-layer thereof. The substrate 201 may include another semiconductor material, such as germanium. The substrate 201 may include a III/V-group semiconductor substrate, e.g., a chemical compound semiconductor substrate, such as gallium arsenide (GaAs). The substrate 201 may include a Silicon-On-Insulator (SOI) substrate. The isolation layer 202I may be formed through a Shallow Trench Isolation (STI) process.

A gate trench 203 may be formed in the substrate 201. A gate insulation layer 204 is formed conformally over the internal surface of the gate trench 203. A buried word line 205 filling a portion of the gate trench 203 may be formed over the gate insulation layer 204. A sealing layer 206 may be formed inside the gate trench 203 over the gate insulation layer 204 that is not covered by the buried word line 205. The sealing layer 206 may have the same height as the surface of the substrate 201. The top surface of the buried word line 205 may be positioned at a lower level than the top surface of the substrate 201. The buried word line 205 may include a low-resistance metal material. The buried word line 205 may be a stack where a titanium nitride and tungsten are sequentially stacked. According to another embodiment of the present invention, the buried word line 205 may be formed of a titanium nitride (TiN) alone.

A first source/drain region 207 and a second source/drain region 208 may be formed in the substrate 201. The first source/drain region 207 and the second source/drain region 208 may be spaced apart from each other by the gate trench 203. As a result, the buried word line 205, the first source/drain region 207, and the second source/drain region 208 may form the cell transistor T. A short-channel effect of the cell transistor T may be improved due to the buried word line 205.

A bit line contact plug 209 may be formed over the substrate 201. The bit line contact plug 209 may be directly in contact, i.e., coupled to the first source/drain region 207. The bit line contact plug 209 may be positioned in the inside of a bit line contact hole 210. The bit line contact hole 210 may be formed in a hard mask layer 211. The hard mask layer 211 may be formed over the substrate 201. The bit line contact hole 210 may expose the first source/drain region 207. The bottom surface of the bit line contact plug 209 may be lower than the top surface of the substrate 201. The bit line contact plug 209 may include the epitaxial structures E1 and E' of FIGS. 1 and 2. According to another embodiment of the present invention, the bit line contact plug 209 may be formed of polysilicon or a metal material. A portion of the bit line contact plug 209 may have a shorter line width than the diameter of the bit line contact hole 210. As a result, gaps G may be formed on both sides of the bit line contact plug 209. The gaps G may be independently formed on both sides of the bit line contact plug 209. After all, one bit line contact plug 209 and a pair of gaps G may be positioned in the inside of the bit line contact hole 210, and the pair of gaps G may be isolated by the bit line contact plug 209. A gap G may be positioned between the bit line contact plug 209 and a silicon plug 216.

A bit line structure BL may be formed over the bit line contact plug 209. The bit line structure BL may include the bit line 212 which is in direct contact with the bit line contact plug 209 and a bit line capping layer 213 formed on top of the bit line 212. The bit line structure BL may have a shape of a line extending in a direction intersecting with the buried word line 205. At least a portion of the bit line 212 may be coupled to the bit line contact plug 209. When viewed from the direction of the A-A', the bit line 212 and the bit line contact plug 209 may have the same line width. Therefore, the bit line 212 may extend in one direction while covering the bit line contact plug 209. The bit line 212 may include a metal material. The bit line capping layer 213 may include an insulation material.

A spacer element 214 may be formed on a sidewall of the bit line structure BL. The spacer element 214 may be formed of a plurality of spacers. The bottom portion of the spacer element 214 may fill the gaps G on both sides of the bit line contact plug 209. The spacer element 214 may include a silicon oxide, a silicon nitride, or a combination thereof. The spacer element 214 may include a NON (Nitride-Oxide-Nitride) structure. According to another embodiment of the present invention, the spacer element 214 may include an air gap. For example, the spacer element 214 may include a NAN (Nitride-Air-Nitride) structure.

A cell contact structure C1 may be formed between two neighboring bit line structures BL. The cell contact structure C1 may be formed in a storage node contact hole 215. The storage node contact hole 215 may have a high aspect ratio. The cell contact structure C1 may be coupled to the second source/drain region 208. The cell contact structure C1 may include the silicon plug 216 and a metal plug 218. The upper portion of the metal plug 218 may be extended to overlap with a portion of the upper surface of the bit line structure BL. The metal plug 218 may be adjacent to the bit line 212. The silicon plug 216 may be adjacent to the bit line contact plug 209. When viewed from a direction (which is the direction of C-C' shown in FIG. 5A) in parallel with the bit line structures BL, a plug isolation layer 219 may be formed between the two neighboring cell contact structures C1. The plug isolation layer 219 may be formed between the two neighboring bit line structures BL, and the storage node contact hole 215 may be provided along with the hard mask layer 211.

The cell contact structure C1 may further include an interface layer 217 and a metal silicide layer 220 between the silicon plug 216 and the metal plug 218.

The silicon plug 216 may correspond to the epitaxial layers 104 and 104' shown in FIGS. 1 and 2. Therefore, the silicon plug 216 may be formed through a bottom-up growth process. The silicon plug 216 may include a lightly doped SEG SiP. According to another embodiment of the present invention, the silicon plug 216 may include SEG Si doped with an N-type dopant, SEG SiGe doped with an N-type dopant, or SEG SiC doped with an N-type dopant.

The interface layer 217 may correspond to the interface layers 105 and 105' shown in FIGS. 1 and 2. Therefore, the interface layer 217 may include a heavily doped SEG SiP.

The silicon plug 216 and the interface layer 217 may be doped with the same dopant or different dopants. The silicon plug 216 and the interface layer 217 may have different dopant concentrations.

The interface layer 217 may have a higher dopant concentration than the silicon plug 216. The silicon plug 216 may have a dopant concentration lower than approximately $1 \times 10^{19}$ atoms/cm$^3$. The dopant concentration of the interface layer 217 may range from approximately $1.0 \times 10^{19}$ atoms/cm$^3$ to approximately $1.0 \times 10^{22}$ atoms/cm$^3$.

The metal plug 218 may include tungsten. The metal silicide layer 220 may include a cobalt silicide. The metal silicide layer 220 and the metal plug 218 may correspond to the metal structures M shown in FIGS. 1 and 2.

A capping layer 221 may be formed between the metal plug 218 of the cell contact structure C1 and the upper portion of the bit line structure BL.

A memory element 300 may be formed over the cell contact structure C1 partially overlapping and in direct contact with the metal plug and the capping layer 221. The memory element 300 may include a capacitor including a storage node. The storage node may be of a pillar type. Although not illustrated, a dielectric layer and a plate node may be further formed over a storage node. The storage node may be of a cylindrical shape, instead of the pillar type. According to another embodiment of the present invention, various memory elements may be coupled over the cell contact structure C1. When the memory element 300 includes a storage node, the cell contact structure C1 may be referred to as a storage node contact plug.

FIGS. 6A to 6K are cross-sectional views illustrating a method for fabricating the semiconductor device in accordance shown in FIG. 5. In a DRAM device, in addition to a cell region where memory cells are formed, a peripheral circuit region for controlling input/output of data to/from the memory cells may be included. When a plurality of elements are formed in the cell region and the peripheral circuit region, some of the elements may be formed concurrently, in other words, some of the elements may be formed to be merged. Hereafter, a method for fabricating the semiconductor device according to the A-A' direction of FIG. 5A is described.

Figure 6A:
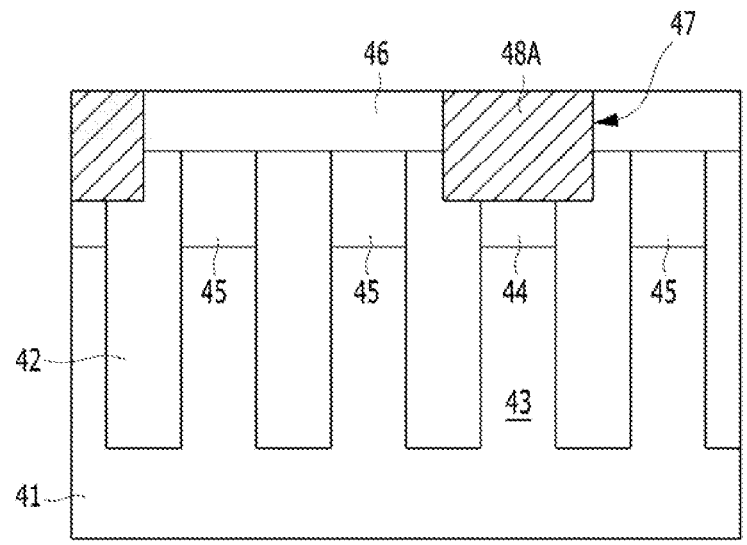
FIGS. 6A to 6K are cross-sectional views illustrating a method for fabricating the semiconductor device shown in FIGS. 5A to 5C.

Referring to FIG. 6A, an isolation layer 42 may be formed in a substrate 41. The isolation layer 42 may be formed through a Shallow Trench Isolation (STI) process. The isolation layer 42 may define a plurality of active regions 43. The active regions 43 may be formed in an island type cross section having a short axis and a long axis. The active regions 43 may be isolated by the isolation layer 42. The isolation layer 42 may include a silicon nitride, a silicon oxide, or a combination thereof.

As shown in FIG. 5C, a buried gate-type cell transistor including a gate trench 201, a gate insulation layer 204, a buried word line 205, and a sealing layer 206 may be formed.

Subsequently, a plurality of first source/drain regions 44 and a plurality of second source/drain regions 45 may be formed in the active regions 43. Among the first source/drain regions 44 and the second source/drain regions 45, the first source/drain regions 44 are to be coupled to bit lines, and the second source/drain regions 45 are to be coupled to memory elements.

Subsequently, a hard mask layer 46 may be formed. The hard mask layer 46 may include a silicon oxide. The hard mask layer 46 may include TEOS (TetraEthyl OrthoSilicate). The hard mask layer 46 may be used as an etch barrier while the gate trench for forming buried word lines is formed.

Subsequently, a first contact hole 47 may be formed. The first contact hole 47 may be formed by using a contact mask (not shown) and etching the hard mask layer 46. The first contact hole 47 may have a circular shape or an oval shape when looked from a top view perspective. The first contact hole 47 may expose a portion of the surface of the substrate 41. The first contact hole 47 may have a diameter subject to a predetermined line width. The first contact hole 47 may expose a portion of the active region 43. For example, the first contact hole 47 may expose the first source/drain regions 44. The first contact hole 47 may have a diameter longer than the length of the short-axis direction of the active region 43. Therefore, in the etch process for forming the first contact hole 47, a portion of the first source/drain region 44 and a portion of the isolation layer 42 may be etched. In other words, the first source/drain regions 44 and the isolation layer 42 below the first contact hole 47 may be recessed to a predetermined depth. As a result, the lower portion of the first contact hole 47 may be expanded.

Subsequently, a preliminary plug 48A may be formed. The preliminary plug 48A may be formed through a selective epitaxial growth process. For example, the preliminary plug 48A may include a SEG SiP. As described above, the preliminary plug 48A may be formed substantially free of any voids through the selective epitaxial growth process.

Figure 6B:
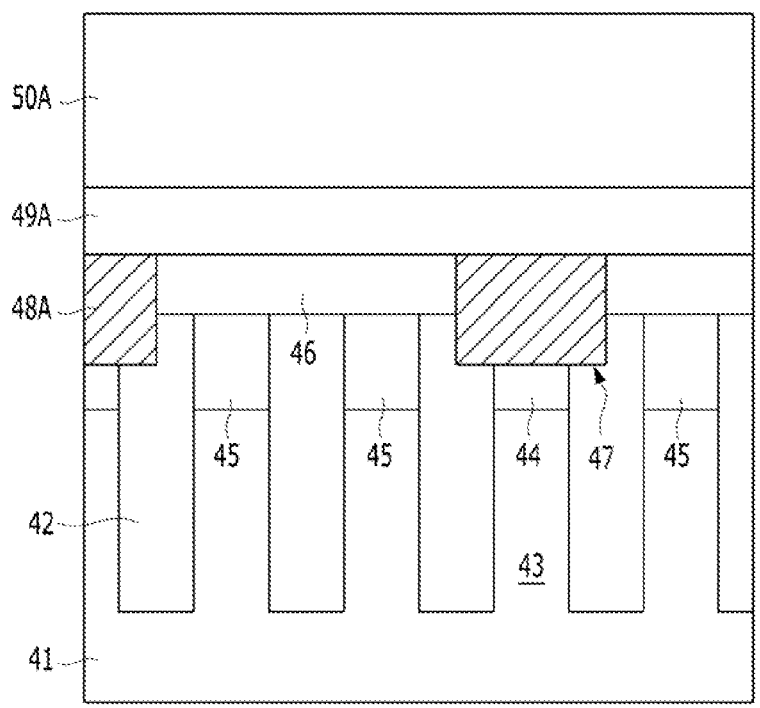

Referring to FIG. 6B, a conductive layer 49A and a capping layer 50A may be stacked sequentially on top of the structure of FIG. 6A. The conductive layer 49A and the capping layer 50A may be sequentially stacked over the preliminary plug 48A and the hard mask layer 46. The conductive layer 49A may include a metal-containing material. The conductive layer 49A may include a metal, a metal nitride, a metal silicide, or a combination thereof. In an embodiment, the conductive layer 49A may include tungsten (W). According to another embodiment of the present invention, the conductive layer 49A may include a stacked structure (TiN/W) of titanium nitride (TiN) and tungsten (W). Herein, the titanium nitride (TiN) may function as a barrier. The capping layer 50A may be formed of an insulation material having an etch selectivity with respect to the conductive layer 49A and the preliminary plug 48A. The capping layer 50A may include a silicon oxide or a silicon nitride. According to another embodiment of the present invention, the capping layer 50A may include a silicon nitride.

Figure 6C:
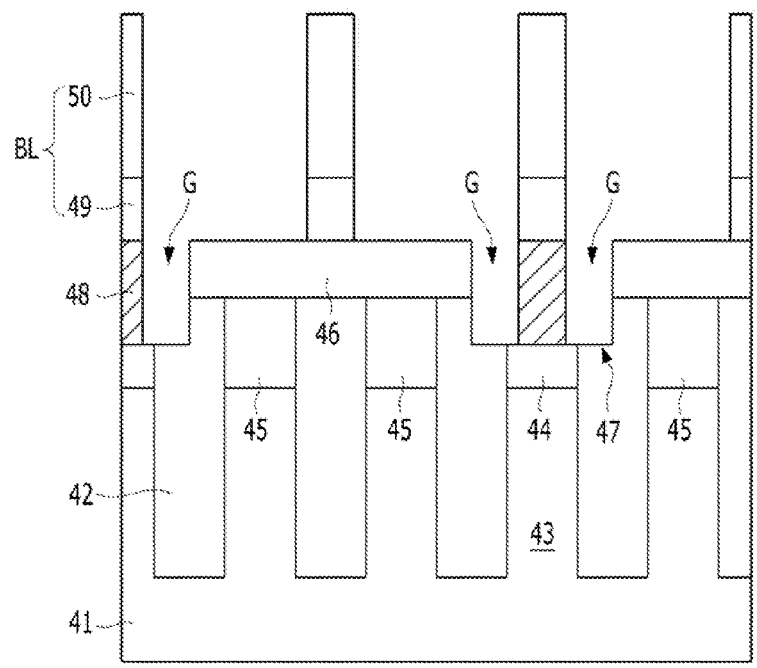

Referring to FIG. 6C, a bit line structure BL and a bit line contact plug 48 may be formed. The bit line structure BL and the bit line contact plug 48 may be simultaneously formed.

The bit line structure BL and the bit line contact plug 48 may be formed through an etch process using a bit line mask.

The capping layer 50A and the conductive layer 49A may be etched by using the bit line mask (not shown) as an etch barrier. As a result, the bit line structure BL including a bit line 49 and a bit line capping layer 50 may be formed. The bit line 49 may be formed by etching the conductive layer 49A. The bit line capping layer 50 may be formed by etching the capping layer 50A.

Subsequently, the preliminary plug 48A may be etched to have the same line width as that of the bit line 49. As a result, the bit line contact plug 48 may be formed. The bit line contact plug 48 may be formed over the first source/drain region 44. The bit line contact plug 48 may couple the first source/drain region 44 and the 10 bit line 49 to each other. The bit line contact plug 48 may be formed in the inside of the first contact hole 47. The line width of the bit line contact plug 48 may be shorter than the diameter of the first contact hole 47. Therefore, a gap G may be formed in the surrounding of the bit line contact plug 48.

As described above, as the bit line contact plug 48 is formed, the gap G may be formed in the inside of the first contact hole 47. This is because the bit line contact plug 48 may be etched to be smaller than the diameter of the first contact hole 47. The gap G may be formed not only in a surrounding shape enclosing the bit line contact plug 48 but also formed on both sidewalls of the bit line contact plug 48 independently. After all, one bit line contact plug 48 and a pair of gaps G may be positioned in the inside of the first contact hole 47, and the pair of gaps G may be isolated from each other by the bit line contact plug 48.

Figure 6D:
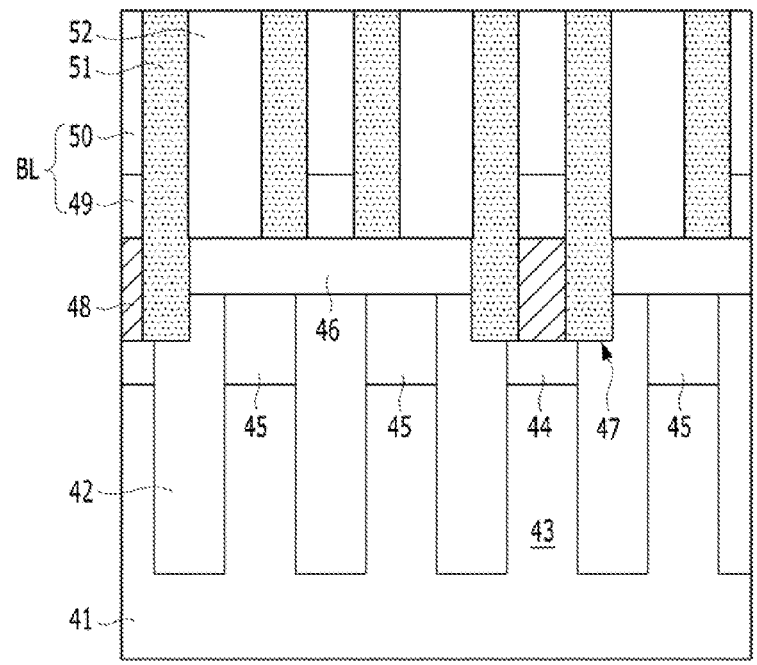

Referring to FIG. 6D, a spacer element 51 may be formed. The spacer element 51 may be positioned on the sidewalls of the bit line structure BL and the bit line contact plug 48. The spacer element 51 may be formed of a plurality of spacers. The spacer element 51 may fill the gap G while covering both sidewalls of the bit line contact plug 48 and the bit line structure BL. The spacer element 51 may include a silicon oxide, a silicon nitride, or a combination thereof. According to another embodiment of the present invention, the spacer element 51 may include an air gap AIR.

Subsequently, an inter-layer dielectric layer 52 may be formed. The inter-layer dielectric layer 52 may fill the space between the bit line structures BL over the spacer element 51. The inter-layer dielectric layer 52 may include a silicon oxide. The inter-layer dielectric layer 52 may include a spin-on dielectric material (SOD). Subsequently, the inter-layer dielectric layer 52 may be planarized to expose the upper portion of the bit line structure BL. As a result, the inter-layer dielectric layer 52 may be positioned between the bit line structures BL. When viewed from a top view perspective, the inter-layer dielectric layer 52 may be in parallel with the bit line structures BL.

Figure 6E:
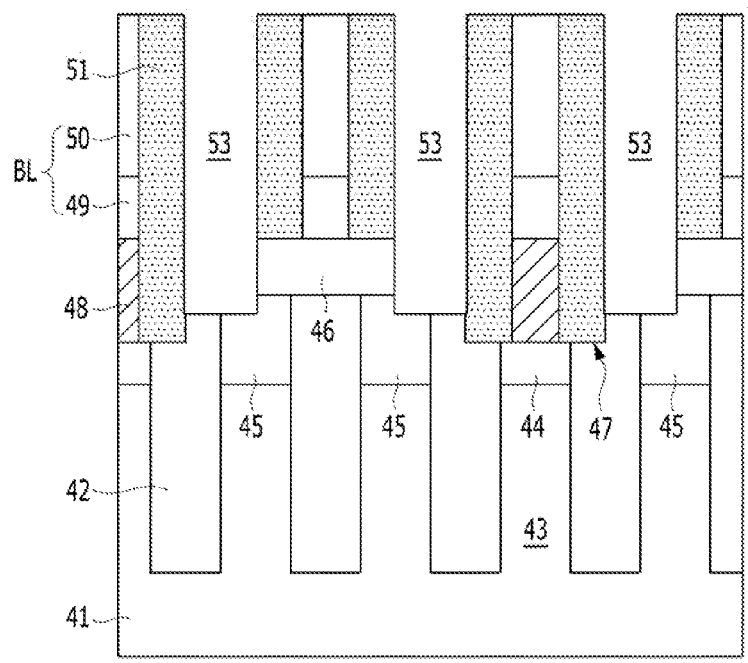

Referring to FIG. 6E, a plurality of second contact holes 53 may be formed. Each of the second contact holes 53 may be formed between the bit line structures BL. Herein, the Damascene process may be performed to form the second contact holes 53. For example, a plug isolation portion may be formed by etching a portion of the inter-layer dielectric layer 52, and the plug isolation portion may be filled with a plug isolation layer (refer to '219' of FIG. 5C). Subsequently, the second contact holes 53 may be formed by removing a remaining portion of the inter-layer dielectric layer 52. The plug isolation layer may be formed by applying and planarizing a layer of silicon nitride. Each of the second contact holes 53 may have a square shape when looked from a top view perspective. The size of the second contact holes 53 may be decided by the spacer elements 51, the plug isolation layer, and the bit line structure BL.

Subsequently, the bottom portion of the second contact holes 53 may be expanded. To this end, the hard mask layer 46 may be etched by being self-aligned to the spacer elements 51. Therefore, the second source/drain region 45 under the second contact holes 53 may be exposed. Subsequently, portions of the isolation layer 42 and the second source/drain region 45 may be recessed to a predetermined depth.

As described above, the second contact holes 53 may correspond to the openings of the first embodiment and the second embodiment. The second contact holes 53 may have a high aspect ratio.

Figure 6F:
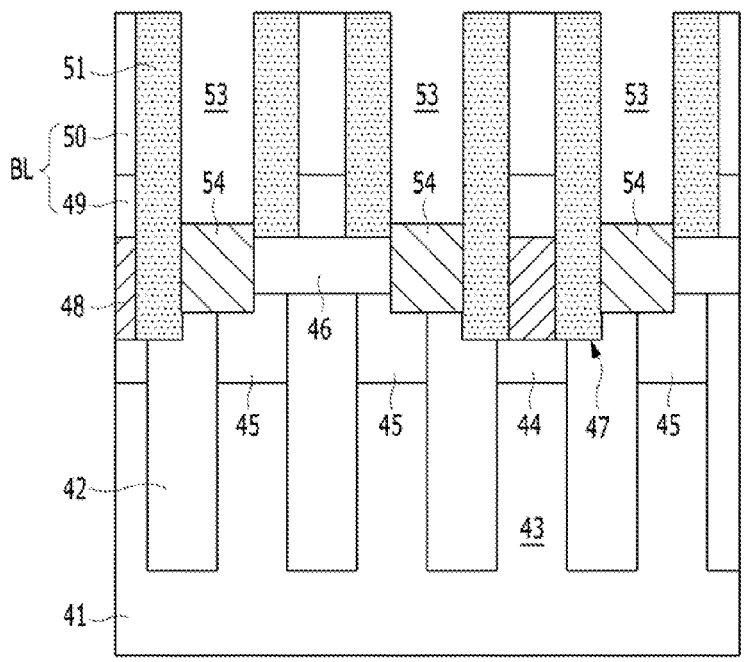

Referring to FIG. 6F, silicon plugs 54 filling a portion of the second contact holes 53 may be formed. The silicon plugs 54 may be the same as the epitaxial layer 14 of FIG. 3B. Therefore, the silicon plugs 54 may be formed through a bottom-up growth process. The silicon plugs 54 may be formed through a selective epitaxial growth process. The silicon plugs 54 may include a lightly doped SEG SiP. According to another embodiment of the present invention, the silicon plugs 54 may include SEG Si doped with an N-type dopant, SEG SiGe doped with an N-type dopant, or SEG SiC doped with an N-type dopant.

Figure 6G:
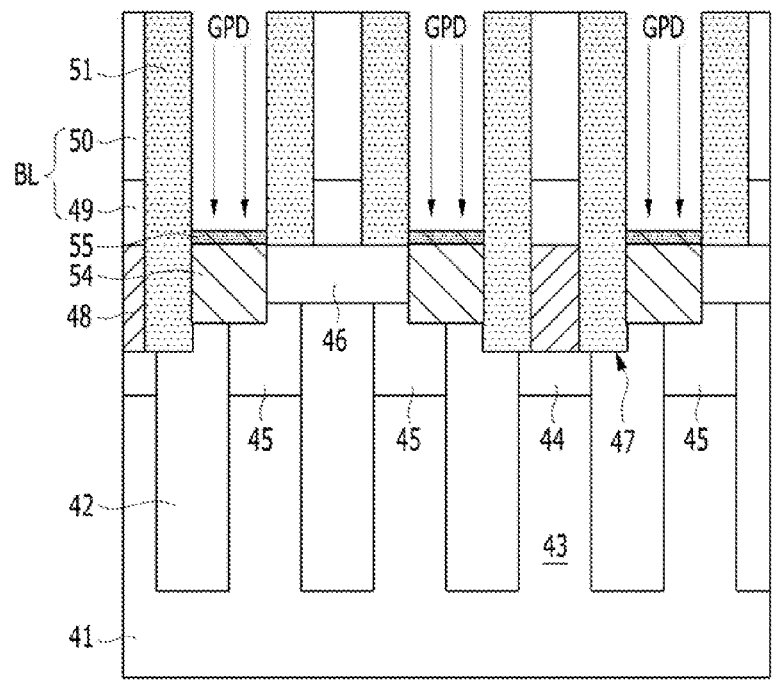

Referring to FIG. 6G, an interface layer 55 may be formed. The interface layer 55 may be the same as the interface layer 16 shown in FIG. 3C. Therefore, the interface layer 55 may be performed through an in-situ gas-phase doping (GPD) process right after the forming of the silicon plugs 54. The interface layer 55 may include a heavily doped SEG SiP.

The silicon plugs 54 and the interface layer 55 may be made of the same material, and doped with the same dopant. The silicon plugs 54 and the interface layer 55 may have different dopant concentrations. The interface layer 55 may have a higher dopant concentration than the silicon plugs 54. The silicon plugs 54 may have a dopant concentration lower than approximately $1 \times 10^{19}$ atoms/cm$^3$. The dopant concentration of the interface layer 55 may range from approximately $1.0 \times 10^{19}$ atoms/cm$^3$ to approximately $1.0 \times 10^{22}$ atoms/cm$^3$.

Subsequently, an annealing process may be performed to activate the dopant doped in the interface layer 55.

According to another embodiment of the present invention, the interface layer 55 may be formed through the method described with reference to FIGS. 4A and 4B. In other words, after the silicon plugs 54 are grown through the selective epitaxial growth process, the interface layer 55 may be formed through an in-situ selective epitaxial growth process.

Figure 6H:
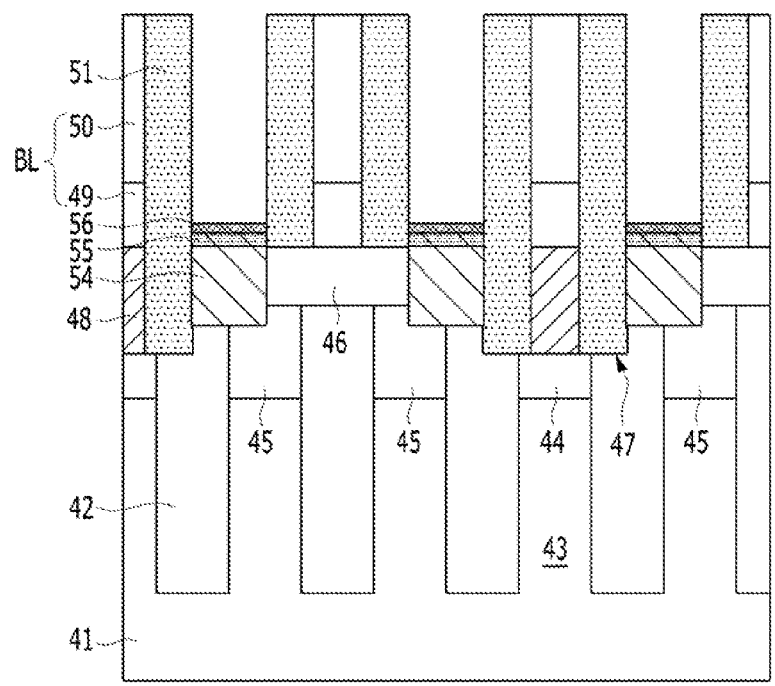

Referring to FIG. 6H, a metal silicide layer 56 may be formed. The metal silicide layer 56 may be formed through a silicide-metal layer deposition process and an annealing process. The method for forming the metal silicide layer 56 may be understood by referring to FIGS. 3D to 3F. The metal silicide layer 56 may include a cobalt silicide, a titanium silicide, or a nickel silicide.

Figure 6I:
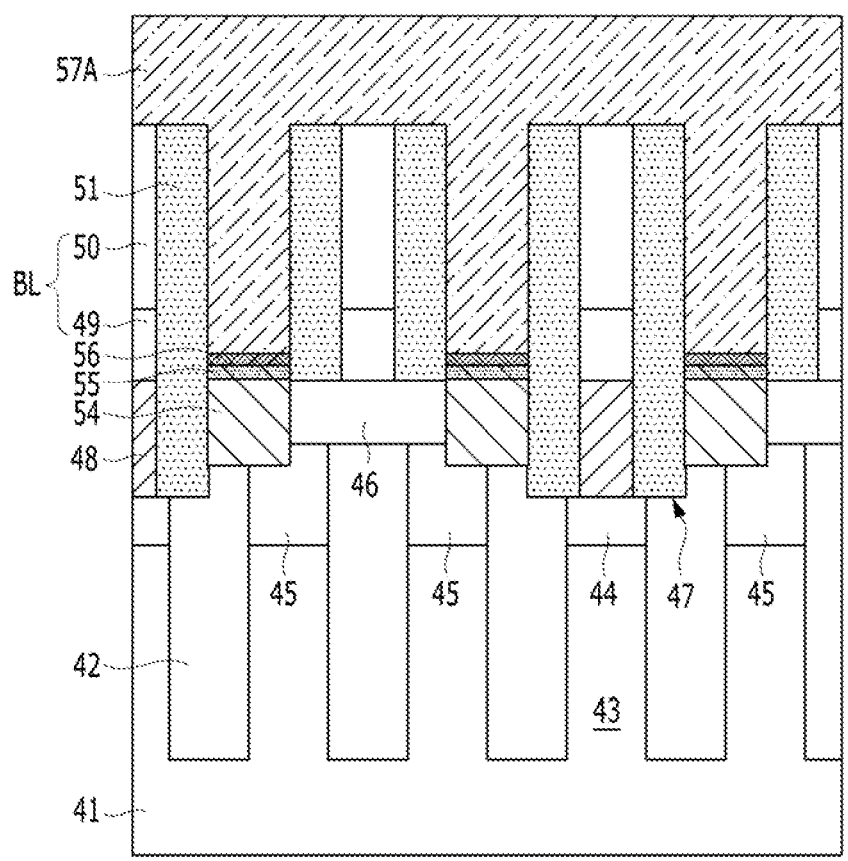
Figure 6J:
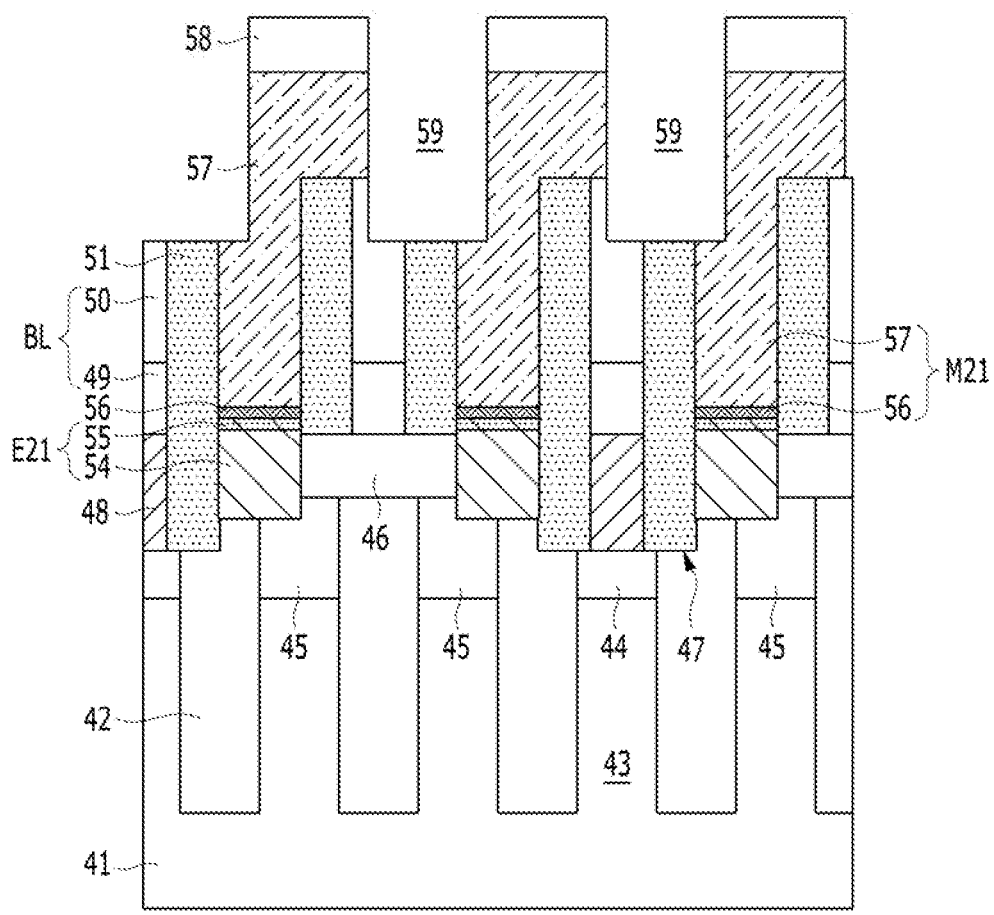

Referring to FIG. 6II, a metal material layer 57A may be formed in the second contact holes 53. A mask 58 may be formed over the metal material layer 57A. The metal material layer 57A may be made of a low-resistance material having a lower resistance than the silicon plug 54 and the interface layer 55. The metal material layer 57A may include titanium, a titanium nitride, tungsten, or a combination thereof. For example, the metal material layer 57A may be a stacked structure (TiN/W) where tungsten is stacked over a titanium nitride.

Referring to FIG. 63, metal plugs 57 may be formed. The metal plugs 57 may further include an extended portion extending up to the upper portion of the bit line structure BL. In short, a portion of the metal plugs 57 may overlap with the upper surface of the bit line structure BL. The metal plugs 57 may be formed by using the mask 58 and etching the metal material layer 57A.

During the etch process for forming the metal plugs 57, portions of the bit line capping layer 50 and the spacer element 51 may be etched. As a result, recesses 59 may be formed.

As described above, an epitaxial structure E21 and a metal structure M21 may be formed in the inside of the second contact holes 53. The epitaxial structure E21 may include a silicon plug 54 and an interface layer 55. The metal structure M21 may include the metal silicide layer 56 and a metal plugs 57.

Figure 6K:
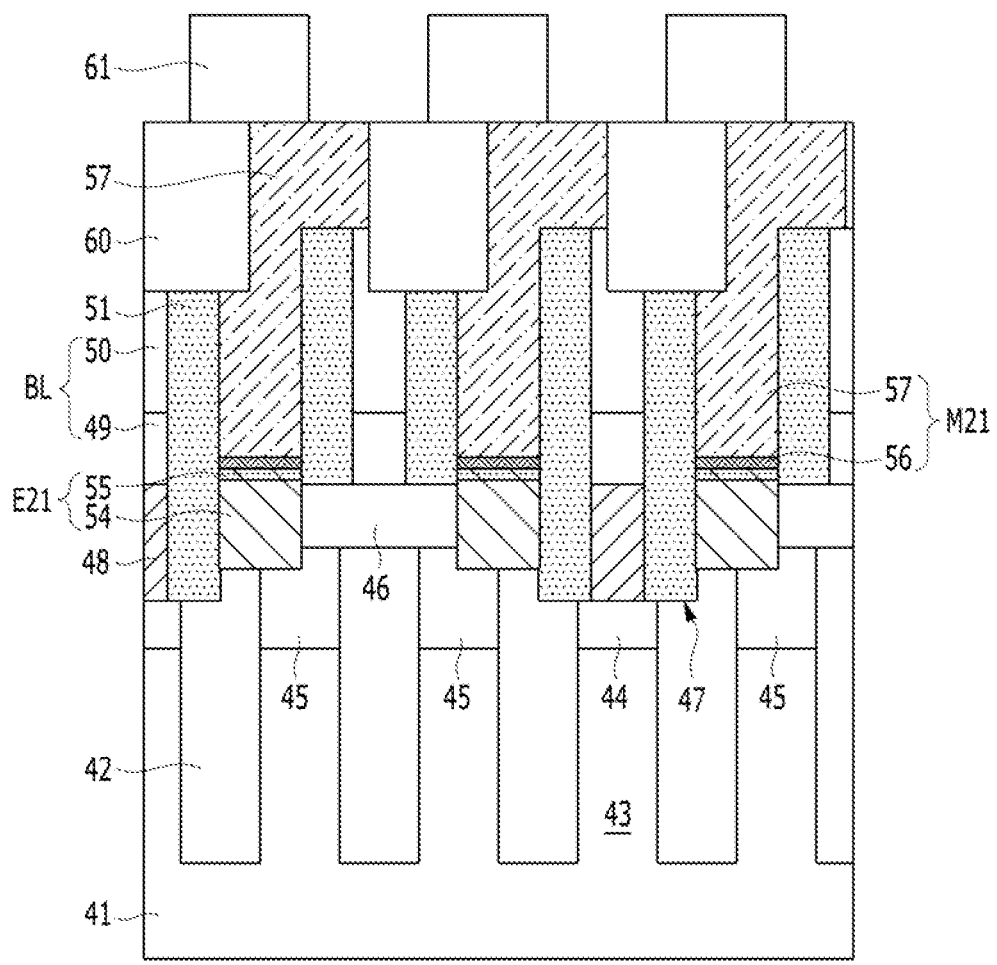

Referring to FIG. 6K, a capping layer 60 may be formed in the inside of the recesses 59. The capping layer 60 may include a silicon oxide, a silicon nitride, or a combination thereof. The capping layer 60 may be planarized to expose the surface of the metal plugs 57.

According to another embodiment of the present invention, an air gap may be formed by etching a portion of the spacer elements 51 before the capping layer 60 is formed.

Subsequently, a memory element 61 including a capacitor may be formed over the metal plugs 57.

A semiconductor device in accordance with the embodiments of the present invention as described above may be applied not only to a Dynamic Random Access Memory (DRAM), but also to Static Random Access Memory (Static Random Access Memory), flash memory, FeRAM (Ferro-electric Random Access Memory), MRAM (Magnetic Random Access Memory), PRAM (Phase-Change Random Access Memory) and the like.

Figure 7:
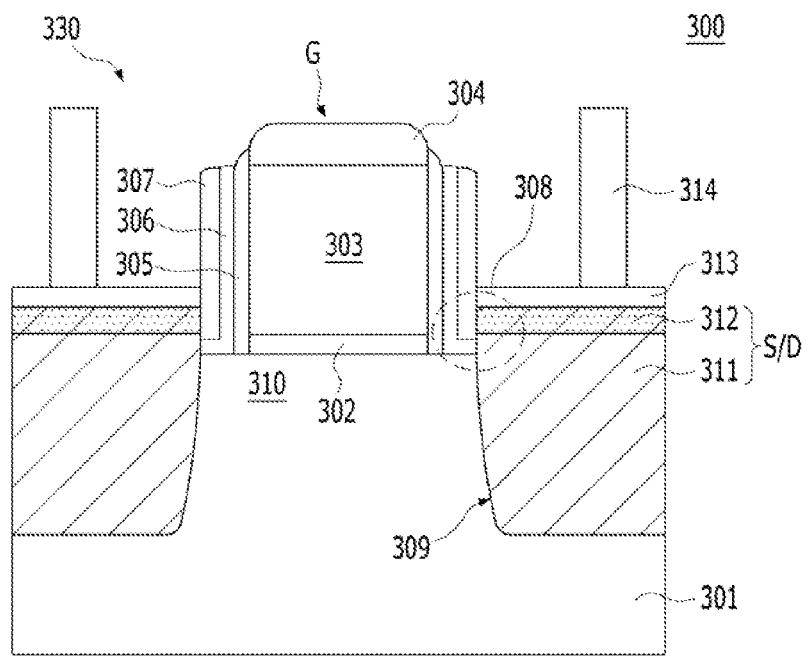
FIG. 7 is a cross-sectional view illustrating a semiconductor device, in accordance with an embodiment of the present invention.

FIG. 7 is a cross-sectional view illustrating a semiconductor device in accordance with an embodiment of the present invention.

Referring to FIG. 7, the semiconductor device 300 may include a transistor 330. The transistor 330 may include a gate structure G and a source/drain region S/D. The transistor 330 may further include a channel region 310 below the gate structure G. Also, the transistor 330 may further include a metal silicide layer 313 and a metal plug 314 over the source/drain region S/D. The transistor 330 may be an NMOSFET.

The transistor 330 may be formed in a substrate 301. The substrate 301 may be formed of a material appropriate for semiconductor processing. The substrate 301 may include a semiconductor substrate. The substrate 301 may be formed of a silicon-containing material. The substrate 301 may include one selected from a group including silicon, monocrystalline silicon, polysilicon, amorphous silicon, silicon germanium, monocrystalline germanium, polycrystalline germanium, carbon-doped silicon, and combinations thereof, or a multi-layer thereof. The substrate 301 may include another semiconductor material, such as germanium. The substrate 301 may include a III/V-group semiconductor substrate, e.g., a chemical compound semiconductor substrate, such as gallium arsenide (GaAs). The substrate 11 may include a Silicon-On-Insulator (SOI) substrate.

A gate structure G may be formed over the substrate 301. The gate structure G may include a gate insulation layer 302, a gate electrode 303, and a gate capping layer 304. The gate insulation layer 302 may include a silicon oxide, a silicon nitride, a silicon oxynitride, a high-k material, or a combination thereof. The high-k material may be a material having a greater dielectric constant than a dielectric constant of a silicon oxide. For example, the high-k material may include a material having a dielectric constant greater than approximately 3.9. According to another embodiment of the present invention, the high-k material may include a material having a dielectric constant greater than approximately 10. According to yet another embodiment of the present invention, the high-k material may include a material having a dielectric constant from approximately 10 to approximately 30. The high-k material may include at least one metallic element. The high-k material may include hafnium-containing material. The hafnium-containing material may include a hafnium oxide, a hafnium silicon oxide, a hafnium silicon oxynitride, or a combination thereof. According to another embodiment of the present invention, the high-k material may include a lanthanum oxide, a lanthanum aluminum oxide, a zirconium oxide, a zirconium silicon oxide, a zirconium silicon oxynitride, an aluminum oxide, or a combination thereof. Instead of the above high-k material, other known high-k materials may be selectively used. According to another embodiment of the present invention, the gate insulation layer 302 may be formed in a stacked structure of a silicon oxide and a high-k material. The gate electrode 303 may be made of a silicon-based material, a metal-based material, or a combination thereof. According to the present embodiment, the gate electrode 303 may be a metal-containing layer. The gate electrode 303 may include a titanium nitride, tungsten, or a combination thereof. The gate electrode 303 may be made of a work-function metal material. The gate capping layer 304 may be made of an insulation material. The gate capping layer 304 may include a silicon oxide, a silicon nitride, or a combination thereof.

The gate structure G may further include a gate spacer. The gate spacer may have a multi-layer structure. The gate spacer may include a first spacer 305, a second spacer 306, and a third spacer 307. The first spacer 305 and the third spacer 307 may be formed of the same material. The second spacer 306 may be formed of a material different from those of the first spacer 305 and the third spacer 307. The first spacer 305 and the third spacer 307 may be made of a silicon nitride, and the second spacer 306 may be made of a silicon oxide. The gate spacer may have a NON-structure. The gate spacer of the NON structure may be used to control a proximity between the epitaxially grown source/drain region S/D and the gate structure G.

The source/drain region S/D may be formed in the inside of a source/drain recess 309. The source/drain recess 309 may be formed in the substrate 301 under both sides of the gate structure G. The source/drain recess 309 may be formed at both ends of a channel region 310. According to another embodiment of the present invention, the source/drain recess 309 may have a sigma ($\Sigma$) shape.

The source/drain region S/D may include an epitaxial layer 311 and an interface layer 312. The epitaxial layer 311 may fully fill the source/drain recess 309. The interface layer 312 may be positioned over the epitaxial layer 311 and contact the third spacer 307 in a bottom corner 308 of the gate structure G. The epitaxial layer 311 and the interface layer 312 may be formed through a selective epitaxial grown process SEG. The epitaxial layer 311 and the interface layer 312 may apply a stress to the channel region 310. For example, the epitaxial layer 311 and the interface layer 312 may apply a tensile stress to the channel region 310. In this way, the carrier mobility in the channel region 310 may be increased.

The epitaxial layer 311 may correspond to the epitaxial layers 104 and 104' shown in FIGS. 1 and 2. Therefore, the epitaxial layer 311 may be formed through a bottom-up growth process. The epitaxial layer 311 may include a lightly doped SEG SiP. According to another embodiment of the present invention, the epitaxial layer 311 may include SEG Si doped with an N-type dopant or SEG SiC doped with an N-type dopant.

The interface layer 312 may correspond to the interface layers 105 and 105' shown in FIGS. 1 and 2. Therefore, the interface layer 312 may include a heavily doped SEG SiP.

The epitaxial layer 311 and the interface layer 312 may be doped with the same dopant or different dopants. The epitaxial layer 311 and the interface layer 312 may have different dopant concentrations. The interface layer 312 may have a higher dopant concentration than the epitaxial layer 311. The epitaxial layer 311 may have a dopant concentration lower than approximately $1\times10^{19}$ atoms/cm$^3$. The dopant concentration of the interface layer 312 may range from approximately $1.0\times10^{19}$ atoms/cm$^3$ to approximately $1.0\times10^{22}$ atoms/cm$^3$.

The interface layer 312 may be formed through an in-situ gas-phase doping process performed right after the formation of the epitaxial layer 311. Through the in-situ gas-phase doping process, the upper portion of the epitaxial layer 311 may be defined as the interface layer 312. In other words, the interface layer 312 may be positioned in the inside of the upper portion of the epitaxial layer 311. The in-situ gas-phase doping process may be understood by referring to the above-described embodiments of the present invention.

According to an embodiment of the present invention, the interface layer 312 may be formed through a selective epitaxial growth process. For example, after the epitaxial layer 311 is formed, the interface layer 312 may be grown through the selective epitaxial growth process in-situ.

The transistor 330 in accordance with an embodiment of the present invention may be a planar gate-type transistor.

According to a modified example of an embodiment of the present invention, the source/drain region S/D may be applied to a FinFET. Also, the gate structure G of the transistor 330 may be formed through a gate first process or a gate last process.

The transistor 330 in accordance with an embodiment of the present invention may be an NMOSFET in a CMOSFET.

FIGS. 8A to 8E are cross-sectional views illustrating a method for fabricating the semiconductor device shown in FIG. 7.

Figure 8A:
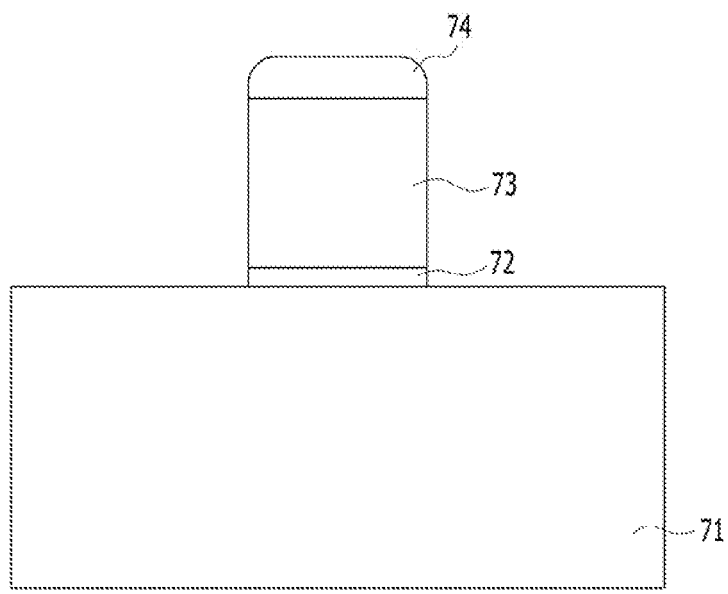
FIGS. 8A to 8E are cross-sectional views illustrating a method for fabricating the semiconductor device shown in FIG. 7.

Referring to FIG. 8A, a substrate 71 may be prepared. The substrate 71 may include a silicon substrate. Although not illustrated, an isolation layer may be further formed in the substrate 71.

A gate stack may be formed over the substrate 71. The gate stack may include a gate insulation layer 72, a gate electrode 73, and a gate capping layer 74. The gate insulation layer 72 may include a silicon oxide, a silicon nitride, a silicon oxynitride, a high-k material, or a combination thereof. According to another embodiment of the present invention, the gate insulation layer 72 may be formed as a stacked layer of an interface layer and a high-k material. The gate electrode 73 may be made of a silicon-based material, a metal-based material, or a combination thereof. According to an embodiment of the present invention, the gate electrode 73 may be made of a metal-containing material. The gate electrode 73 may include a titanium nitride, tungsten, or a combination thereof. The gate electrode 73 may be made of a work-function metal material. The gate electrode 73 may have an N-type work function or a P-type work function. When an NMOSFET is formed, the gate electrode 73 may have an N-type work function. When a PMOSFET is formed, the gate electrode 73 may have a P-type work function. For a work-function engineering, diverse work-function materials may be used. The gate capping layer 74 may be made of an insulation material. The gate capping layer 74 may include a silicon oxide, a silicon nitride, or a combination thereof. The gate capping layer 74 may be used as an etch barrier while a gate photolithography process is performed.

Figure 8B:
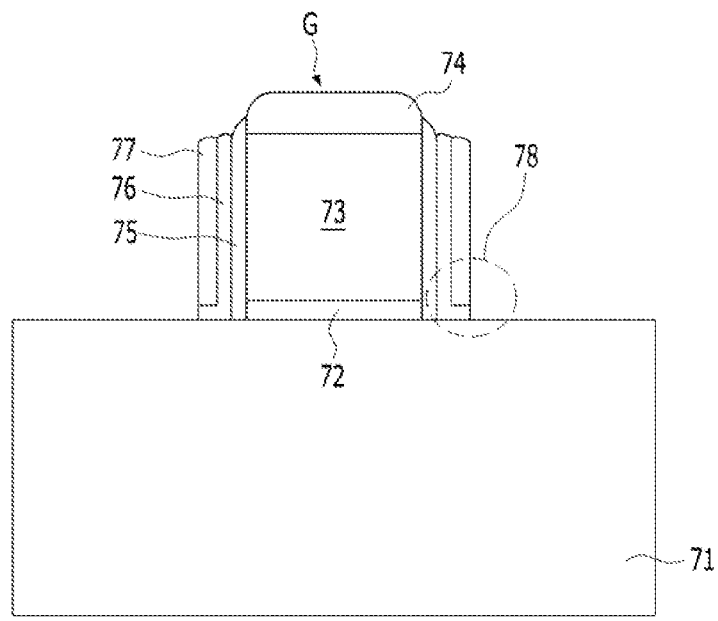

Referring to FIG. 8B, a gate spacer may be formed on both sidewalls of the gate stack. The gate spacer may be made of an insulation material. The gate spacer may include a silicon oxide, a silicon nitride, or a combination thereof. The gate spacer may have a multi-layer structure. According to an embodiment of the present invention, the gate spacer may include a first spacer 75, a second spacer 76, and a third spacer 77. The first spacer 75 and the third spacer 77 may be formed of the same material. The second spacer 76 may be formed of a material different from those of the first spacer 75 and the third spacer 77. The first spacer 75 and the third spacer 77 may be formed of a silicon nitride, and the second spacer 76 may be formed of a silicon oxide. The gate spacer may be formed by performing a blanket etch process onto the spacers. After the spacers are formed over the upper surface and sidewalls of the gate stack, an etch-back process may be performed. According to another embodiment of the present invention, the first spacer 75 may be formed first and subsequently, the second spacer 76 and the third spacer 77 may be formed. The third spacer 77 may not contact the surface of the substrate 71. The bottom portions of the first spacer 75 and the third spacer 77 may not contact the surface of the substrate 71. Therefore, the gate spacer may have a NON-structure. The gate spacer of the NON-structure may be used to control a proximity between the epitaxially grown source/drain region S/D and the gate structure G. The proximity may be a significant parameter that is directly related to electrical characteristics. The thickness of the gate spacer may be adjusted to control the proximity. In other words, it is important to control the thickness of the remaining gate spacer. During a recess etch process performed before the epitaxial growth, the thickness of the gate spacer becomes so thin that the thickness of the gate spacer is hardly controlled. Therefore, the NON-structure may have a sufficient thickness by covering the upper portion of the first spacer 75 with the second spacer 76 and then covering the resultant structure with the third spacer 77. As a result, the proximity may be controllable. In this way, a controllability of the proximity may be increased, and an epitaxial layer 81 and an interface layer 82 may be epitaxially grown with the well-controlled proximity. According to another embodiment of the present invention, the upper portion of the first nitride spacer may be covered with a sacrificial oxide spacer, and then the resultant structure may be covered with a second nitride spacer. Subsequently, when the sacrificial oxide spacer and the second nitride spacer are removed through a process of removing the sacrificial oxide spacer, the first nitride spacer may remain thin after all. Nevertheless, the proximity may be well controllable.

Through the series of the processes described above, a gate structure G including the gate stack and the gate spacer may be formed. The gate structure G may include a gate bottom corner 78.

Figure 8C:
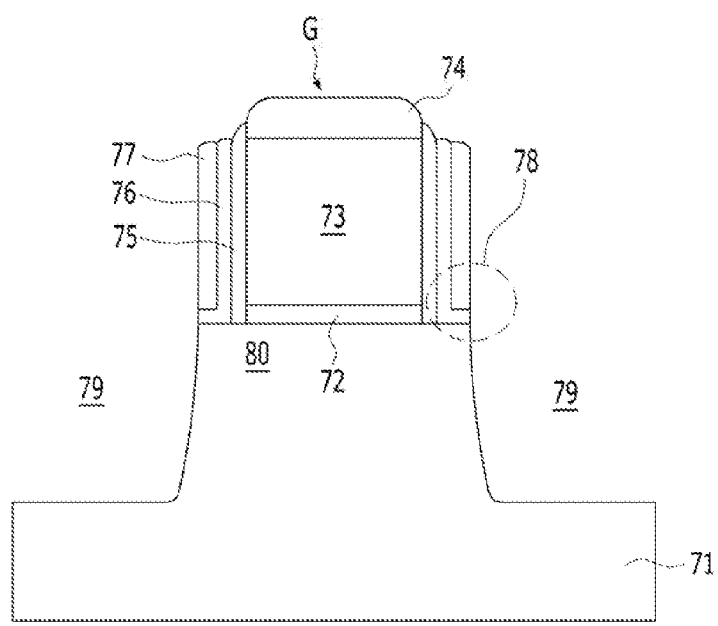

Referring to FIG. 8C, at least one source/drain recess 79 may be formed in the substrate 71. A portion of the substrate 71 under both sides of the gate structure may be etched to form the source/drain recess 79. The depth of the source/drain recess 79 may depend on diverse etch conditions. To form the source/drain recess 79, a dry etch process, a wet etch process, or a combination thereof may be performed. According to another embodiment of the present invention, the source/drain recess 79 may further include an under-cut. The under-cut may be positioned below the gate spacer. According to another embodiment of the present invention, the source/drain recess 79 may have a sigma shape. For example, an etchant such as potassium hydroxide (KOH) may be used to form the source/drain recess 79. The sidewall profile of the source/drain recess 79 may be vertical or inclined. The source/drain recess 79 may define a channel region 80 below the gate structure.

Figure 8D:
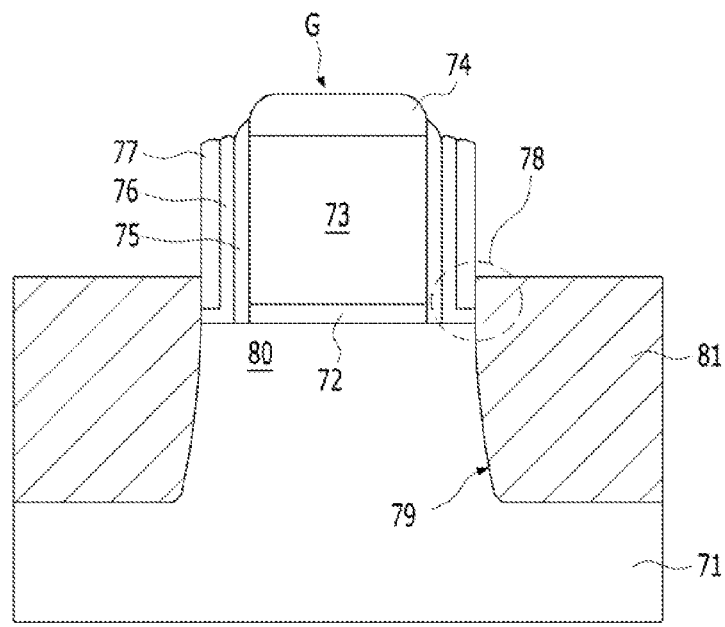

Referring to FIG. 8D, an epitaxial layer 81 may be formed. The epitaxial layer 81 may correspond to the epitaxial layers 104 and 104' shown in FIGS. 1 and 2. Therefore, the epitaxial layer 81 may be formed through a bottom-up growth process, for example, through a selective epitaxial growth process. The epitaxial layer 81 may fill the source/drain recess 79 substantially free of any voids. The epitaxial layer 81 may include a lightly doped SEG SiP. According to another embodiment of the present invention, the epitaxial layer 81 may include SEG Si doped with an N-type dopant, SEG SiGe doped with an N-type dopant, or SEG SiC doped with an N-type dopant. The upper portion of the epitaxial layer 81 may overlap with the second spacer 76 and the third spacer 77.

Figure 8E:
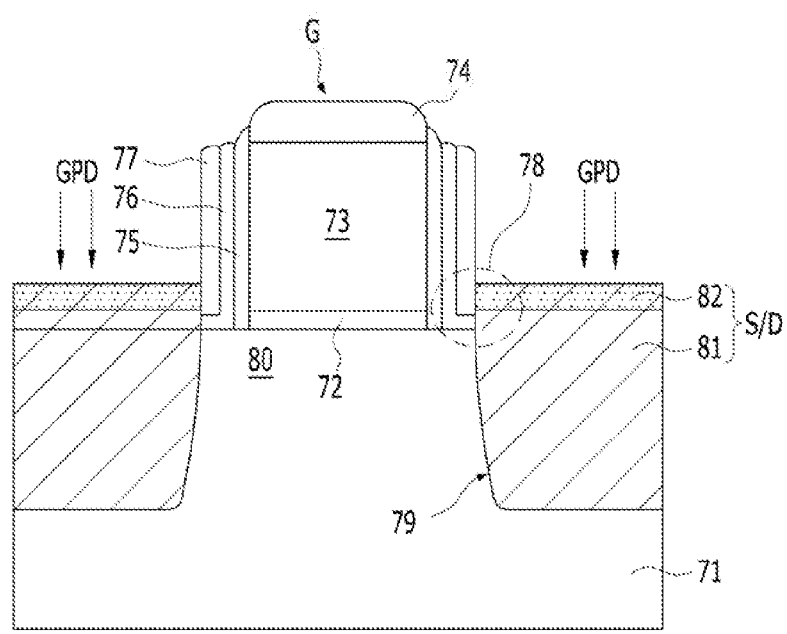

Referring to FIG. 8E, an in-situ gas-phase doping (GPD) process may be performed. Through the in-situ gas-phase doping process, the upper portion of the epitaxial layer 81 may be defined as an interface layer 82. In other words, the interface layer 82 may be positioned on and within the epitaxial layer 81. The interface layer 82 may correspond to the interface layers 105 and 105' shown in FIGS. 1 and 2. Therefore, the interface layer 82 may include a heavily doped SEG SiP. The second spacer 76 and the interface layer 82 may not contact each other. Therefore, it is possible to avoid a dislocation error occurring in the interface between silicon oxide ($SiO_2$) and the heavily doped SEG SiP.

The epitaxial layer 81 and the interface layer 82 may be doped with the same dopant or different dopants. The epitaxial layer 81 and the interface layer 82 may have different dopant concentrations. The interface layer 82 may have a higher dopant concentration than the epitaxial layer 81. The epitaxial layer 81 may have a dopant concentration lower than approximately $1 \times 10^{19}$ atoms/cm$^3$. The dopant concentration of the interface layer 82 may range from approximately $1.0 \times 10^{19}$ atoms/cm$^3$ to approximately $1.0 \times 10^{22}$ atoms/cm$^3$.

The epitaxial layer 81 and the interface layer 82 may be a source/drain region S/D. This may be referred to as an embedded source/drain region S/D. The epitaxial layer 81 and the interface layer 82 may be referred to as a stress-inducing material layer. As a result, a stress may be applied to the channel region 80.

Although not illustrated, after the interface layer 82 is formed, a metal silicide layer and a metal plug may be formed (refer to 'the metal silicide layer 313' and 'the metal plug 314' of FIG. 7).

According to an embodiment of the present invention, since the interface layer 82 has a high dopant concentration, a carrier mobility may be increased even higher.

Also, according to an embodiment of the present invention, since the interface layer 82 has a high dopant concentration, a resistance may be lowered. For example, when a contact material such as a metal silicide layer is formed over the interface layer 82, a contact resistance may be improved.

Also, according to an embodiment of the present invention, since the second spacer 76 and the interface layer 82 are formed not to contact each other, a misfit and a threading dislocation occurring in the SiP/SiO$_2$ interface may be removed.

Figure 9A:
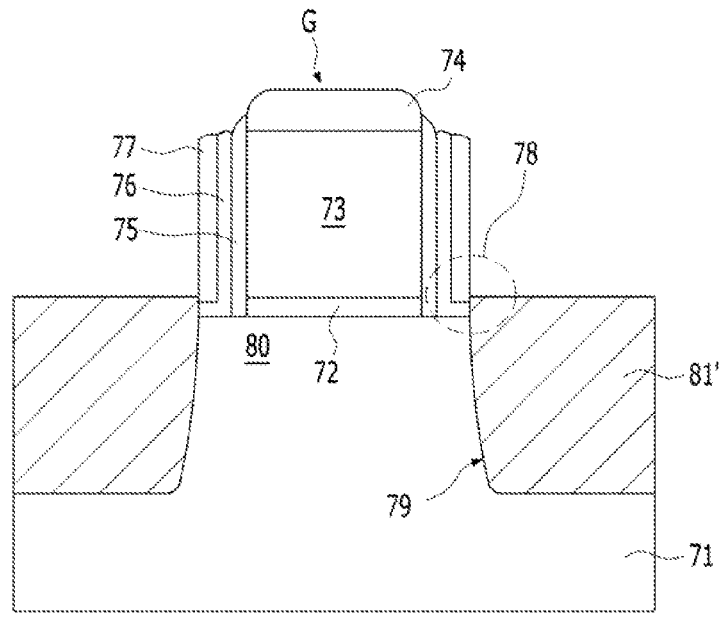
FIGS. 9A and 9B are cross-sectional views illustrating another method for fabricating the semiconductor device shown in FIG. 7.
Figure 9B:
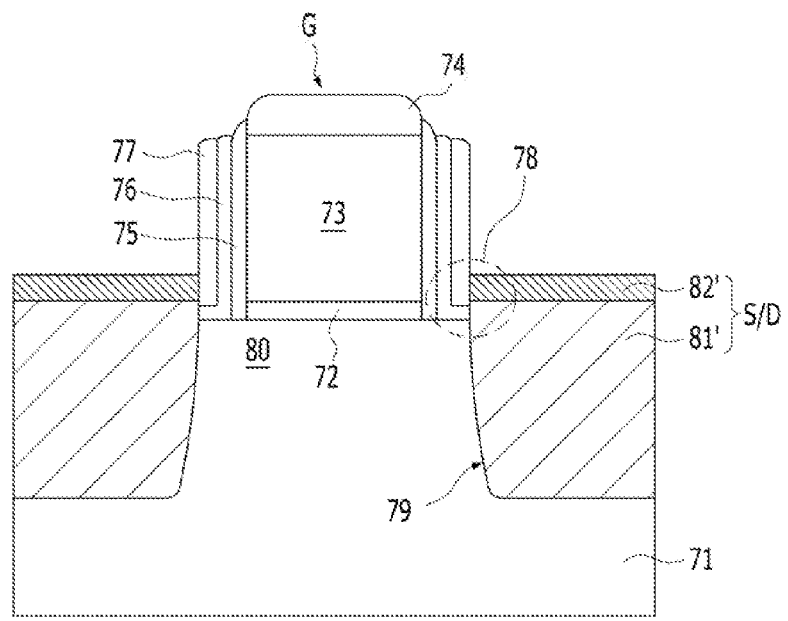

FIGS. 9A and 9B are cross-sectional views illustrating a method for fabricating the semiconductor device shown in FIG. 7.

Referring to FIG. 9A, an epitaxial layer 81' filling the source/drain recess 79 may be formed. The epitaxial layer 81' may be formed through a bottom-up growth process, e.g., a selective epitaxial growth process. The epitaxial layer 81' may overlap with the gate bottom corner 78. The epitaxial layer 81' may contact the third spacer 77. The epitaxial layer 81' may fill the source/drain recess 79 substantially free of any voids. The epitaxial layer 81' may include a lightly doped SEG SiP. According to another embodiment of the present invention, the epitaxial layer 81' may include SEG Si doped with an N-type dopant, SEG SiGe doped with an N-type dopant, or SEG SiC doped with an N-type dopant.

Referring to FIG. 9B, the interface layer 82' may be formed through an in-situ selective epitaxial growth process. The epitaxial layer 81' may overlap with the gate bottom corner 78. The second spacer 76 and the interface layer 82' may not contact each other. The interface layer 82' may include a heavily doped SEG SiP. The phosphorus concentration in the interface layer 82' may range from approximately $1.0 \times 10^{19}$ atoms/cm$^3$ to approximately $1.0 \times 10^{22}$ atoms/cm$^3$.

Although not illustrated, after the interface layer 82 is formed, a metal silicide layer and a metal plug may be formed.

According to an embodiment of the present invention, an opening of a high aspect ratio may be filled substantially free of any voids by performing a Selective Epitaxial Growth (SEG) process, upon forming a contact structure.

According to an embodiment of the present invention, a semiconductor device fabrication process may be simplified by performing a high-concentration doping process in-situ right after performing the SEG process, upon forming a contact structure.

The technology of the present invention, eliminates the need of ion-implantation equipment which are costly. Therefore, not only the electrical characteristics of a semiconductor device may be improved by employing the present invention but also production costs may be reduced remarkably.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a semiconductor structure including a pattern;
   forming an epitaxial layer having a first dopant concentration in the pattern;
   forming in-situ an interface layer having a second dopant concentration higher than the first dopant concentration, over the epitaxial layer;

forming a metal silicide layer over the interface layer; and
forming a metal plug over the metal silicide layer.

2. The method of claim 1, wherein the epitaxial layer is formed through a selective epitaxial growth (SEG) process, and after performing the selective epitaxial growth process, an in-situ gas-phase doping process is performed to form the interface layer.

3. The method of claim 2, wherein the selective epitaxial growth process includes supplying a silicon source gas and an N-type dopant gas in-situ, and
the in-situ gas-phase doping process includes supplying a phosphorus-containing dopant gas.

4. The method of claim 3, wherein a phosphorus concentration of the interface layer that is formed through the in-situ gas-phase doping process ranges from approximately $1.0 \times 10^{19}$ atoms/cm$^3$ to approximately $1.0 \times 10^{22}$ atoms/cm$^3$.

5. The method of claim 3, wherein the in-situ gas-phase doping process is performed at a temperature ranging from approximately 350° C. to approximately 1000° C.

6. The method of claim 1, wherein the epitaxial layer and the interface layer include an identical dopant.

7. The method of claim 1, wherein the epitaxial layer and the interface layer include SiP, and the phosphorus concentration of the interface layer is higher than a phosphorus concentration of the epitaxial layer.

8. The method of claim 1, wherein the epitaxial layer includes SEG Si doped with an N-type dopant, SEG SiGe doped with an N-type dopant, or SEG SiC doped with an N-type dopant, and
the interface layer includes SEG Si doped with phosphorus, SEG SiGe doped with phosphorus, or SEG SiC doped with phosphorus, and
the phosphorus concentration of the interface layer is higher than an N-type dopant concentration of the epitaxial layer.

9. The method of claim 1, wherein the epitaxial layer is formed through a first selective epitaxial growth process, and the interface layer is formed through a second selective epitaxial growth process in-situ after performing the first selective epitaxial growth process.

10. The method of claim 9, wherein the interface layer is formed thinner than the epitaxial layer.

11. The method of claim 9, wherein the first selective epitaxial growth process includes supplying a silicon source gas and an N-type dopant gas in-situ, and
the second selective epitaxial growth process includes supplying a silicon source gas and a phosphorus-containing dopant gas in-situ.

12. The method of claim 11, wherein a phosphorus concentration of the interface layer that is formed through the second selective epitaxial growth process ranges from approximately $1.0 \times 10^{19}$ atoms/cm$^3$ to approximately $1.0 \times 10^{22}$ atoms/cm$^3$.

13. The method of claim 9, wherein the epitaxial layer includes a first SEG SiP, and the interface layer includes a second SEG SiP with a phosphorus concentration higher than a phosphorus concentration of the first SEG SiP.

14. The method of claim 1, wherein the forming of the semiconductor structure including the pattern of the high aspect ratio includes:
preparing a semiconductor substrate;
forming a source/drain region of a transistor in the semiconductor substrate;
forming an isolation layer over the semiconductor substrate; and
etching the isolation layer to form a contact hole that exposes the source/drain region,
wherein the epitaxial layer, the interface layer, the metal silicide layer, and the metal plug become a contact structure that fills the contact hole.

15. The method of claim 1, wherein the forming of the semiconductor structure including the pattern of the high aspect ratio includes:
preparing a semiconductor substrate;
burying a word line in the semiconductor substrate;
forming a source/drain region in the semiconductor substrate on both sides of the word line;
forming a plurality of bit line structures over the semiconductor substrate; and
forming a contact hole that exposes the source/drain region between the plurality of the bit line structures,
wherein the epitaxial layer, the interface layer, the metal silicide layer, and the metal plug become a contact structure that fills the contact hole.

16. The method of claim 15, further comprising:
forming a memory element over the metal plug, after the forming of the metal plug.

17. The method of claim 1, wherein the forming of the semiconductor structure including the pattern of the high aspect ratio includes:
forming a gate structure over a substrate; and
removing a portion of the substrate to form a source/drain recess below both sides of the gate structure,
wherein the epitaxial layer and the interface layer become a source/drain region that fills the source/drain recess.

18. The method of claim 1, wherein the pattern has a width-to-height ratio greater than approximately 1:1.

19. The method of claim 1, wherein the metal silicide layer includes a cobalt silicide, a titanium silicide, or a nickel silicide.

20. The method of claim 1, wherein the metal plug includes titanium, a titanium nitride, tungsten, or a combination thereof.

* * * * *